(12) United States Patent
Himori et al.

(10) Patent No.: US 9,202,675 B2
(45) Date of Patent: *Dec. 1, 2015

(54) PLASMA PROCESSING APPARATUS AND ELECTRODE FOR SAME

(75) Inventors: Shinji Himori, Nirasaki (JP); Daisuke Hayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 769 days.

This patent is subject to a terminal disclaimer.

(21) Appl. No.: 12/718,627

(22) Filed: Mar. 5, 2010

(65) Prior Publication Data

US 2010/0224325 A1    Sep. 9, 2010

Related U.S. Application Data

(60) Provisional application No. 61/242,576, filed on Sep. 15, 2009.

(30) Foreign Application Priority Data

Mar. 6, 2009   (JP) ................. 2009-053437
Dec. 28, 2009  (JP) ................. 2009-297689

(51) Int. Cl.
  *C23F 1/08*   (2006.01)
  *C23C 16/50*  (2006.01)
  *H01J 37/32*  (2006.01)

(52) U.S. Cl.
  CPC ....... *H01J 37/3255* (2013.01); *H01J 37/32577* (2013.01); *H01J 37/32082* (2013.01); *H01J 37/32091* (2013.01); *H01J 37/32174* (2013.01); *H01J 37/32183* (2013.01)

(58) Field of Classification Search
  USPC ........ 156/345.44, 345.47, 345.43; 118/723 E
  See application file for complete search history.

(56) References Cited

U.S. PATENT DOCUMENTS 5,557,215 A * 9/1996 Saeki et al. ............. 324/756.01
5,716,451 A * 2/1998 Hama et al. ................ 118/723 I
6,165,276 A * 12/2000 Lu et al. ......................... 118/728

(Continued)

FOREIGN PATENT DOCUMENTS

CN    1745463 A    3/2006
CN  101123200 A    2/2008

(Continued)

OTHER PUBLICATIONS

Machine Generated English Translation of JP 2008-042115 published Feb. 21, 2008.*

(Continued)

*Primary Examiner* — Sylvia R Macarthur
(74) *Attorney, Agent, or Firm* — Rothwell, Figg, Ernst & Manbeck, P.C.

(57) ABSTRACT

A plasma processing apparatus includes a processing chamber in which a target object is processed by a plasma, a first and a second electrode that are provided in the processing chamber to face each other and have a processing space therebetween, and a high frequency power source that is connected to at least one of the first and the second electrode to supply a high frequency power to the processing chamber. And at least one of the first and the second electrode includes a base formed of a plate-shaped dielectric material and a resistor formed of a metal and provided between the base and the plasma.

22 Claims, 23 Drawing Sheets

(56) References Cited

U.S. PATENT DOCUMENTS

| | | |
|---|---|---|
| 7,585,386 B2 | 9/2009 | Okumura et al. |
| 2005/0276928 A1 | 12/2005 | Okumura et al. |
| 2006/0221540 A1 | 10/2006 | Himori et al. |
| 2008/0073032 A1 | 3/2008 | Koshiishi et al. |
| 2008/0151467 A1 | 6/2008 | Simpson |
| 2009/0025632 A1 | 1/2009 | Buechel et al. |
| 2009/0285998 A1 | 11/2009 | Okumura et al. |
| 2010/0224323 A1* | 9/2010 | Himori .................... 156/345.33 |
| 2010/0224325 A1* | 9/2010 | Himori et al. ............ 156/345.44 |

FOREIGN PATENT DOCUMENTS

| | | |
|---|---|---|
| JP | 2001-298015 A | 10/2001 |
| JP | 2004-363552 | 12/2004 |
| JP | 2005-228973 A | 8/2005 |
| JP | 2005-347620 A | 12/2005 |
| JP | 2007-132757 A | 5/2007 |
| JP | 2008-42115 A | 2/2008 |
| JP | 2008-42117 A | 2/2008 |
| JP | 2008-243973 A | 10/2008 |
| WO | 2004/070808 A1 | 8/2004 |

OTHER PUBLICATIONS

Office Action issued Apr. 29, 2011 in Chinese Patent Application No. 201010128803.7 (with an English translation).

Office Action issued Feb. 13, 2012 in Chinese Patent Application No. 201010128803.7 (with an English translation).

U.S. Office Action issued Feb. 11, 2014 in U.S. Appl. No. 12/718,544, filed Mar. 5, 2010, which is now USP 8,888,951, issued Nov. 18, 2014. (20 pages).

\* cited by examiner

<FIRST RESISTOR / PATTERNED RESISTOR>

<FIRST RESISTOR + SECOND RESISTOR / INTEGRATED RESISTOR>

<FIRST RESISTOR + THIRD RESISTOR / JOINT RESISTOR>

<ELECTRODE WITH CHANGED THICKNESS>

<FIRST RESISTOR / CENTRAL OPENING>

<NO DIELECTRIC MATERIAL / NO RESISTOR>

<DIELECTRIC MATERIAL IS PRESENT / NO RESISTOR>

<TAPERED DIELECTRIC MATERIAL IS PRESENT / NO RESISTOR>

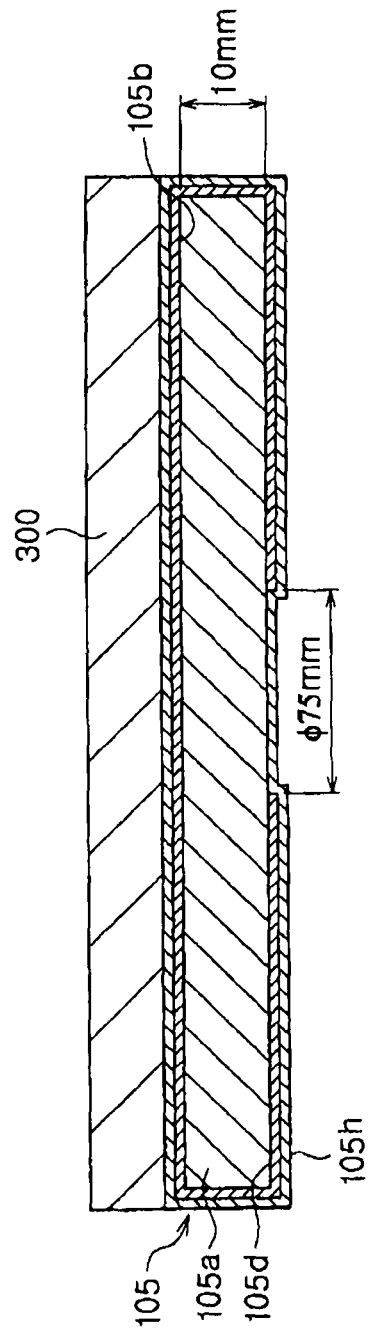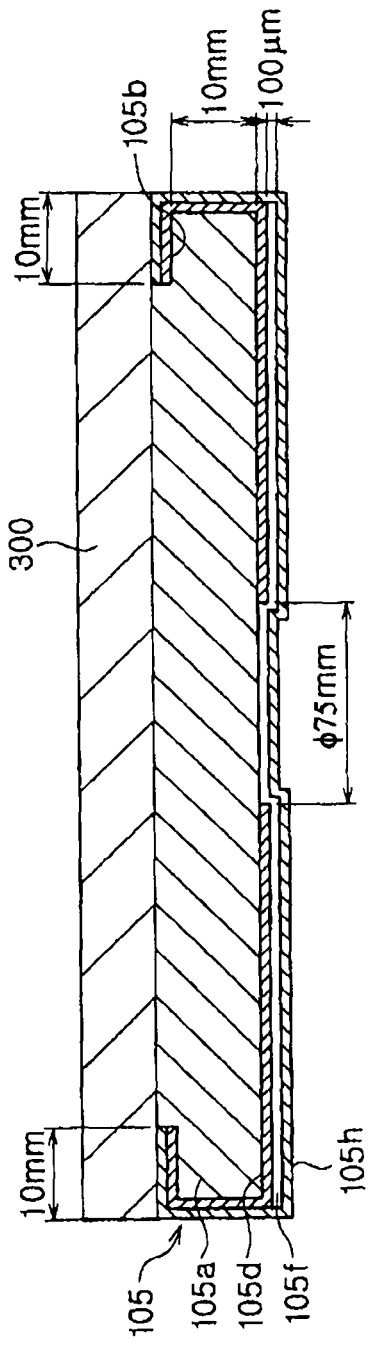

PLASMA PROCESSING APPARATUS AND ELECTRODE FOR SAME

CROSS-REFERENCE TO RELATED APPLICATIONS

This application claims priority to Japanese Patent Application No. 2009-053437 filed on Mar. 6, 2009 and Japanese Patent Application No. 2009-297689 filed on Dec. 28, 2009, the entire contents of which are incorporated herein by reference.

FIELD OF THE INVENTION

The present invention relates to a structure of an electrode used for a plasma processing apparatus and a plasma processing apparatus using same; and, more specifically, to a structure of an electrode for a plasma processing apparatus that may control the distribution of an electric field strength consumed by high frequency power for a generation of plasma between parallel plate type electrodes.

BACKGROUND OF THE INVENTION

As apparatuses become commercially available for performing microprocessing, e.g., etching or film forming, on a target object by plasma action, capacitively coupled (parallel plate type) plasma processing apparatuses, inductively coupled plasma processing apparatuses, and microwave plasma processing apparatuses are commonly utilized. Among these, a parallel plate type plasma processing apparatus applies high frequency power to at least one of an upper electrode and a lower electrode facing each other, to generate electric field energy, thereby exciting a gas to generate plasma, which processes a target object finely.

According to the recent need for miniaturization, it is inevitable to supply relatively high frequency power of, e.g., 100 MHz, to generate high density plasma. As the frequency of power supplied becomes higher, a high frequency current flows along the plasma-side surface of the electrode from its end portion to its central portion due to the skin effect. Such effect causes the electric field strength to be higher at the central portion of the electrode rather than at the end portion of the electrode. Accordingly, the electric field energy consumed for the generation of plasma at the central portion of the electrode is higher than that at the end portion of the electrode, and thus ionization or dissociation of a gas is further accelerated at the central portion of the electrode than at the end portion of the electrode. As a consequence, an electron density Ne at the central portion is higher than that Ne at the end portion. Because a resistivity of the plasma decreases at the central portion of the electrode with a higher electron density Ne, a current with a high frequency (electromagnetic wave) also focuses on the central portion in the facing electrode, thus leading to further nonuniformity of the plasma density.

Accordingly, it has been suggested to bury a dielectric material, e.g., ceramics, in the electrode near the central portion of the plasma-side surface (see, e.g., Japanese Patent Application Publication No. 2004-363552).

It has also been suggested to ensure higher uniformity of a plasma that the dielectric material be formed in a tapered shape or the dielectric material be made thinner in thickness as going from its central portion toward its periphery. FIG. 16 depicts a simulation result of an electric field strength distribution for four different constructions A to D of an upper electrode in a parallel plate type plasma processing apparatus.

The construction A of the upper electrode 900 includes a base 905 made of a metal, e.g., aluminum (Al) and an insulation layer 910 made of alumina ($Al_2O_3$) or yttria ($Y_2O_3$) sprayed on the plasma-side surface of the base 905. The construction B of the upper electrode 900 further includes a columnar shaped dielectric material 915 with a dielectric constant ∈ of 10, a diameter of 240 mm, and a thickness of 10 mm, buried in the center of the base 910 in addition to the base 905 and the insulation layer 910. The construction C of the upper electrode 900 includes a tapered dielectric material 915 which is 10 mm thick at its central portion and 3 mm thick at its end portion. The construction D of the upper electrode 900 has a stepped dielectric material 915 that includes a first step with a diameter of 80 mm, a second step with a diameter of 160 mm, and a third step with a diameter of 240 mm. As a result, in a case where there is no dielectric material as shown in "A" of FIG. 16, the electric field strength was higher at the central portion of the electrode than that at the end portion of the electrode. This will be described with reference to FIG. 17A. Assuming that electric field strength distribution is E/Emax when the maximum electric field strength is Emax under each condition, it can be seen that the electric field strength distribution E/Emax at the plasma-side of the electrode 900 becomes dense at the central portion owing to a high frequency current flowing from the end portion of the electrode 900 to the central portion of that.

On the other hand, in a case where the columnar shaped dielectric material 915 shown in "B" of FIG. 16, the electric field strength distribution E/Emax was lowered at the bottom portion of the dielectric material. Referring to FIG. 17B, the capacitance component C of the dielectric material 915 and a sheath capacitance component (not shown) function as a voltage divider and the electric field strength distribution E/Emax is lowered at the central portion of the electrode 900. And, there occurs nonuniformity in electric field strength distribution E/Emax at the end portion of the dielectric material 915.

In a case where a tapered dielectric material 915 is provided as shown in "C" of FIG. 16, there was an improvement in uniformity of electric field strength distribution E/Emax made from the end portion of the electrode toward the central portion of the electrode. Referring to FIG. 17C, it is considered that since the capacitance component was higher at the end portion of the dielectric material 915 than at the central portion of that, the electric field strength distribution E/Emax was not excessively lowered at the end portion of the dielectric material 915 compared to a case where a flat type dielectric material 915 was provided and this allowed a uniform electric field strength distribution.

In a case where there is provided a dielectric material 915 having steps as shown in "D" of FIG. 16, there occurred steps in electric field strength distribution E/Emax as compared to the case where a tapered dielectric material 915 is provided as shown in "C" of FIG. 16. However, this case allowed a more uniform electric field strength distribution than the case where the columnar shaped dielectric material 915 is provided as shown in "B" of FIG. 16. The simulation result showed that the case, where a tapered dielectric material is provided, exhibited the most uniform electric field strength distribution E/Emax and thus this case allowed plasma to be generated most uniformly.

However, it suffers from the following problem to bury the tapered dielectric material 915 in the base 905. An additive or a screw is used to join the dielectric material 915 with the base 905. Since the base 905 is formed of a metal, e.g., aluminum and the dielectric material 915 is formed of ceramics, there occurs a difference in linear heat expansion. In consideration of this, there is a need for providing a proper gap between the members.

If the dielectric material 915 has a tapered shape, the dimensional accuracy is deteriorated at the tapered portion due to a lack of machining accuracy. This results in stress concentration due to a difference in heat expansion. The stress concentration is also caused by a difference in thermal conductivity due to a discrepancy in dimensional tolerance at the mating interface or a discrepancy in thickness of the dielectric material. An adhesive is peeled off from the mating interface due to the stress concentration. Since the difference in thermal expansion coefficient makes it difficult to manage the gap due to a difference in heat expansion, the peeled adhesive escapes from the gap, which causes a contamination in the chamber. Further, among the insulation layer 910 sprayed on the surface of the dielectric material 915 formed of ceramic or the like and the insulation layer 910 sprayed on the surface of the base 905 formed of aluminum or the like, it is likely for the insulation layer sprayed on the dielectric material formed of ceramic or the like to be peeled off due to a difference in adhesive strength. As a result, a contamination in the chamber is also caused by peeling of the material sprayed on the dielectric material 915.

SUMMARY OF THE INVENTION

In view of the above, the present invention provides a plasma processing apparatus that may control an electric field strength distribution at the plasma-side surface of a parallel plate type electrode and an electrode for the plasma processing apparatus.

In accordance with a first embodiment of the present invention, there is provided a plasma processing apparatus including: a processing chamber in which a target object is processed by a plasma; a first and a second electrode that are provided in the processing chamber to face each other and have a processing space therebetween; and a high frequency power source that is connected to at least one of the first and the second electrode to supply a high frequency power to the processing chamber, wherein at least one of the first and the second electrode includes: a base formed of a plate-shaped dielectric material; and a resistor formed of a metal and provided between the base and the plasma.

With such configuration, when a high frequency current flows along the metal surface of the conductive cover, the high frequency energy is distributed due to capacitance of the dielectric base located at the opening of the conductive cover. Accordingly, it may further reduce the electric field strength distribution to form the base with a dielectric material than with a metal. In addition, the electrode according to the present invention further includes the first resistor formed of a metal between the base and plasma. The degree of variation in high frequency electric field strength distribution may be controlled by adjusting the position and shape of the first resistor. As a result, the high frequency current flows along the skin of the first resistor as well as the metal surface of the conductive cover. The high frequency energy is partially converted into Joule heat due to the resistance of the first resistor while the current flows through the first resistor and the converted Joule heat is consumed, thus creating a potential distribution due to the current and resistance. This makes it possible to gradually lower the high frequency electric field strength at the position where the first resistor is arranged.

As the impedance at the electrode side increases, the electric field energy consumed for plasma decreases. In the electrode according to the present invention, thus, the shape of the conductive cover and position and shape of the first resistor are set so that the impedance at the central portion of the electrode is gradually increased compared to the impedance at the end portion of the electrode. For example, the electric field strength at the bottom portion of the electrode may be controlled by patterning the first resistor, thus capable of generating plasma with uniform plasma density Ne.

Further, since there is no need of making the dielectric material tapered, machining costs may be saved. Due to a discrepancy in dimensional tolerance and difference in thickness of dielectric material, stress concentration conventionally occurred and this caused the adhesive or sprayed material to be peeled off. The peeling was a cause of contamination. In the construction according to the present invention, however, the first dielectric material does not necessarily have a tapered shape, thus capable of reducing peeling of the adhesive or sprayed material and suppressing contamination.

Further, it may be possible to achieve improved uniform heating property and suppressed stress concentration by forming the nearly overall part of the electrode with the same material (dielectric material). Further, spraying a metal on the base allows for higher adhesivity than spraying a dielectric material on the base. In the electrode according to the present invention, accordingly, the metallic conductive cover and the first resistor are sprayed on the dielectric base, and thus adhesivity is raised between the conductive cover and the first resistor and the base, thus capable of improving propagation efficiency of high frequency power.

Further, as shown in FIG. 3A, if the base 905a of the electrode 905 is formed of a metal such as aluminum, the metal surface formed of aluminum is exposed at the inner wall surfaces of the gas hole 920 and this leads to concentration of electric fields on the metal surface, thus causing abnormal discharge near the gas hole 920. Accordingly, in a case where the base 905a is formed of a metal, it is necessary to provide the sleeve 925 made of a dielectric material, such as alumina, in the gas hole 920, resulting in increase in number of parts and high costs. On the other hand, as shown in FIG. 3B, if the base of the electrode is formed of a dielectric material, the metal is not exposed at the inner wall surfaces of the gas hole 210 and accordingly there is no problem with abnormal discharge. Thus, it is not necessary to provide a sleeve in the gas hole, thereby saving costs.

There may be further provided a conductive cover which has an opening and covers the base.

The resistor may be patterned.

The at least one of the first and second electrodes may further include a dielectric cover that covers the base at the plasma side surface of the base, wherein the first resistor is buried in the dielectric cover.

The dielectric cover may be formed by one of spraying, attaching a taper or a sheet-shaped member, ion plating, and plating.

The resistor may include a plurality of ring-shaped members spaced from each other by a predetermined distance or a plurality of island-shaped members spaced from each other by a predetermined distance.

The predetermined distance may be set so that its impedance $1/C\omega$ is larger than resistance R of the resistor.

The at least one of the first and second electrodes may further include an additional resistor formed of a metal between the base and the plasma.

A total sheet resistance of the resistor and the additional resistor may range from 20 $\Omega/\square$ to 2000 $\Omega/\square$.

An additional resistor thinner in thickness than the resistor may be provided between the members of the resistor.

High frequency power for generating the plasma may be supplied to one of the first and second electrode and may have a frequency ranging from about 13 MHz to about 100 MHz.

The electrode including the resistor may be an upper electrode and a gas holes may be provided between the members of the resistor.

The resistor may be formed by thermal spraying.

The additional resistor may be formed of a metal and provided between the base and the plasma and the additional resistor may be formed by thermal spraying.

The thermal spraying of the additional resistor may be performed by using a composite resistor containing titanium oxide.

The thermal spraying of the resistor may be performed while leaving at least a part of a surface of the base which faces a plasma space.

The base may be electrically connected to a clamp formed of an electric conductor fixing the base to the processing chamber and supporting the base at an peripheral side of the base.

A sheet resistance of the additional resistor may range from about 20 Ω/□ to about 2000 Ω/□.

A sheet resistance of the resistor may range from about $2\times10^{-4}$ Ω/□ to about 20 Ω/□.

In accordance with a second embodiment of the present invention, there is provided an electrode for use in a plasma processing apparatus that generates a plasma of a gas by an applied high frequency power and performs a plasma processing on a target object by using the generated plasma, wherein the electrode is one of a first and a second electrode disposed to face each other with a plasma processing space therebetween, and the electrode includes: a base formed of a plate-shaped dielectric material; an electrically conductive cover that has an opening and covers the base; and a resistor formed of a metal and provided between the base and the plasma.

As described above, the present invention may control the distribution in strength of a high frequency electric field consumed to generated plasma.

BRIEF DESCRIPTION OF THE DRAWINGS

The above features of the present invention will become apparent from the following description of an embodiment given in conjunction with the accompanying drawing, in which:

FIGS. 20A to 20C show cross sectional views of an electrode including resistors formed by thermal spraying.

DETAILED DESCRIPTION OF THE EMBODIMENTS

Figure 1:
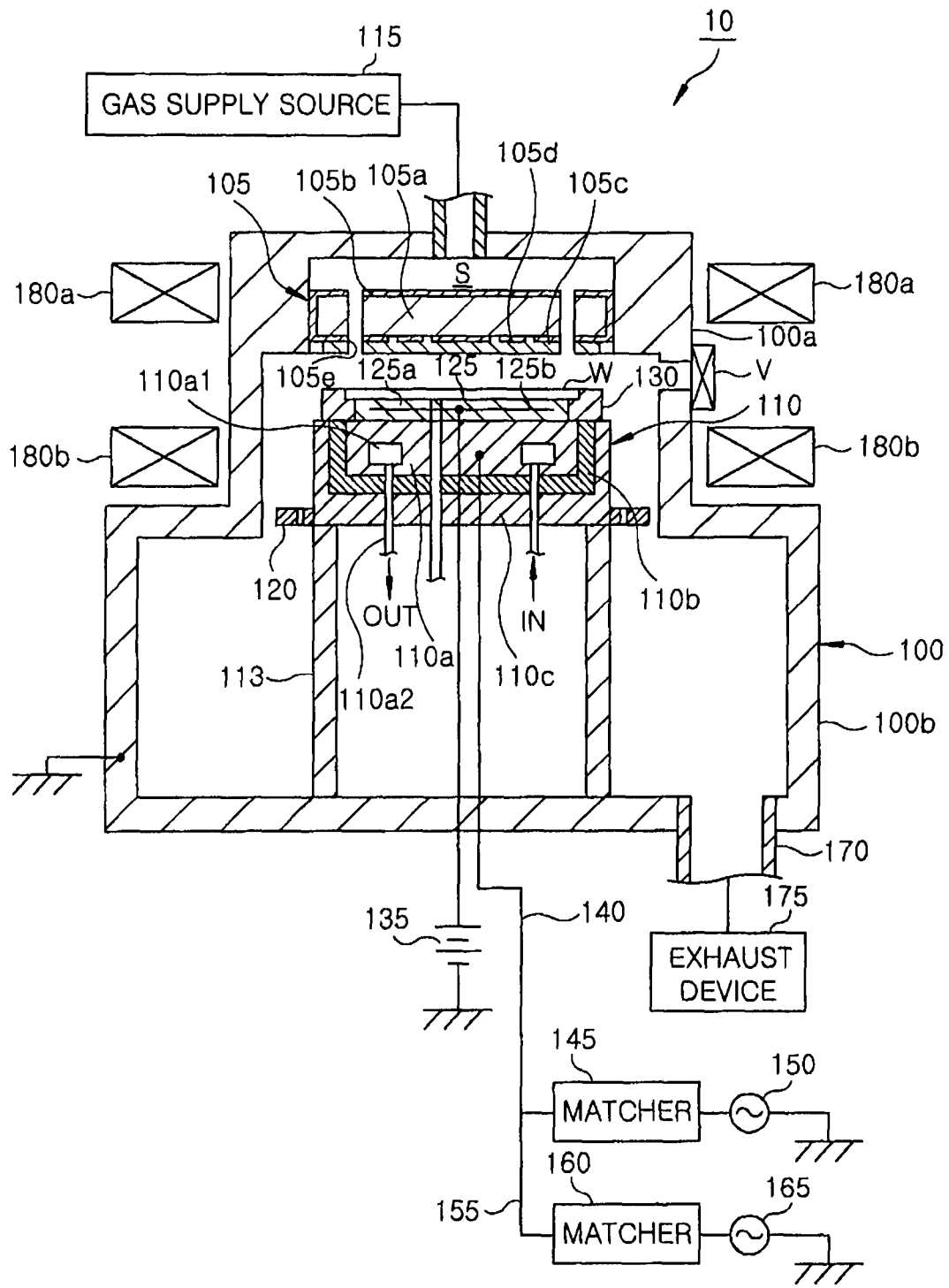
FIG. 1 is a longitudinal cross sectional view illustrating a RIE (Reactive Ion Etching) plasma etching apparatus 10 according to an embodiment of the present invention.

Hereinafter, embodiments of the present invention will be described in greater detail with reference to accompanying drawings which form a part hereof. Through the specification, like reference numerals refer to like elements and the repetitive descriptions will be omitted.

(1) The Entire Construction of the Plasma Processing Apparatus

First of all, the entire construction of a plasma processing apparatus having an electrode according to an embodiment of the present invention will be described with reference to FIG. 1. FIG. 1 depicts a RIE (Reactive Ion Etching) plasma etching apparatus (parallel plate type plasma processing apparatus) having an electrode according to an embodiment of the present invention. The RIE plasma etching apparatus 10 corresponds to a plasma processing apparatus that generates plasma by a high frequency energy and plasma processes a wafer W.

The RIE plasma etching apparatus 10 includes a processing chamber 100 that plasma processes therein the wafer W loaded from a gate valve V. The processing chamber 100 includes an upper cylindrical chamber 100a with a small diameter and a lower cylindrical chamber 100b with a large diameter. The processing chamber 100 is made of a metal, e.g., aluminum (Al), and grounded.

In the processing chamber, an upper electrode 105 and a lower electrode 110 are arranged to face each other, thus constituting a pair of parallel plate electrodes. The upper electrode 105 includes a base 105a, a conductive cover 105b, a dielectric cover 105c, and a first resistor 105d. The base 105a is a plate shaped member that is formed of a dielectric material (ceramics), such as alumina or quartz. The conductive cover 105b has openings and covers the base 105a. The conductive cover 105b is formed of a metal, such as aluminum, carbon, titanium, or tungsten. The conductive cover 105b is brought in tight contact with the base 105a by one of spraying, attaching a tape or sheet-shaped member, ion plating, or plating to have a thickness a few tens of micrometers (μm).

The first resistor 105d is provided between the base 105a and the plasma. The first resistor 105d is formed of a metal with middle resistance as will be described later, such as aluminum, carbon, titanium, or tungsten. The first resistor 105d is a sheet type resistor that has been separated into three ring-shaped members. This shape is an example of the first resistor 105d as patterned. The first resistor 105d is brought in tight contact with the plasma side surface of the base 105a and buried in the dielectric cover 105c. Further, the first resistor 105d may be exposed from the dielectric cover 105c. Alumina is sprayed on the surface of the upper electrode 105.

The upper electrode 105 has a plurality of gas holes 105e penetrating therethrough, so it may serve as a shower plate as well. Specifically, a gas supplied from a gas supply source 115 is diffused in a gas diffusion space S of the processing chamber and then introduced into the processing chamber through the gas holes 105e. Although the gas holes 105e are provided only at end portions of the upper electrode 105 in FIG. 1, the gas holes 105e may also be provided at the central portion of the upper electrode 105. In this case, the gas holes 105e are provided to penetrate through the base 105a, the first dielectric material 105b, the insulation layer 105c, and the first resistor 105d.

The lower electrode 110 includes a base 110a. The base 110a is formed of a metal, e.g., aluminum, and supported by a support 110c via an insulation layer 110b. Accordingly, the lower electrode 110 is electrically "floated". The support 110c is covered at its bottom portion by a cover 113. A baffle plate 120 is provided at the outer periphery of a lower portion of the support 110c to control the flow of the gas.

A coolant portion 110a1 is provided in the base 110a. A coolant is introduced into the coolant portion 110a1 via a "IN" side of a coolant introduction line 110a2. The coolant is circulated in the coolant portion 110a1 and discharged from the coolant portion 110a1 via an "OUT" side of a coolant introduction line 110a2. By doing so, the base 110a is controlled to have a desired temperature.

An electrostatic chuck mechanism 125 is provided over the top surface of the base 110a to mount thereon a wafer W. A focus ring 130 formed of, e.g., silicon, is provided at the outer periphery of the electrostatic chuck mechanism 125 to maintain uniformity of plasma. The electrostatic chuck mechanism 125 includes an insulation member 125a made of, e.g., alumina, and an electrode part 125b, a metal sheet member, which is interposed in the insulation member 125a. A DC (Direct Current) source 135 is connected to the electrode part 125b. A DC voltage from the DC source 135 is applied to the electrode part 125b so that the wafer W is electrostatically adsorbed to the lower electrode 110.

The base 110a is connected to a first matcher 145 and a first high frequency power supply 150 via a first feeder line 140. A gas in the processing chamber is excited by high frequency electric field energy outputted from the first high frequency power supply 150 to generate discharge plasma by which an etching process is performed on the wafer W.

Figure 2:
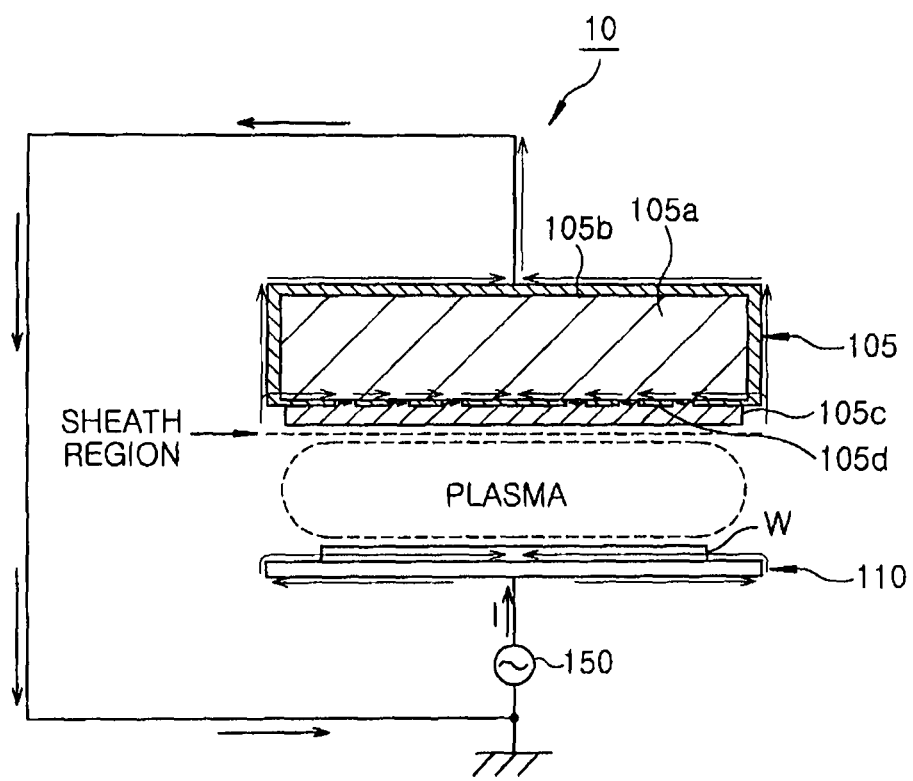
FIG. 2 is a view illustrating a high frequency current with respect to the apparatus.

As shown in FIG. 2, when a high frequency power of, e.g., 100 MHz, is applied from the first high frequency power supply 150 to the lower electrode 110, a high frequency current propagates along the surface of the lower electrode 110 from the end portion of the top surface of the lower electrode 110 to the central portion thereof by skin effect. Accordingly, the electric field strength is higher at the central portion of the lower electrode 110 than at the end portion of the lower electrode 110, thus accelerating ionization or dissociation of the gas at the central portion of the lower electrode 110 than at the end portion of that. As a consequence, the electron density of the plasma Ne is higher at the central portion of the lower electrode 110 than at the end portion of that. As the resistivity of plasma is lower at the central portion of the lower electrode 110, which has a higher electron density of plasma Ne, a high frequency current is concentrated on the central portion of the upper electrode 105 facing the lower electrode 110, thus causing further nonuniformity in density of plasma. In the plasma etching apparatus 10 according to the embodiment, however, the upper electrode 105 includes the first dielectric material 105b and the first resistor 105d. Accordingly, the capacitance component of the first dielectric material 105b and the sheath capacitance component function as a voltage divider, and this may result in uniformity in plasma density by obviating such a phenomenon that the density of plasma is higher at the central portion than at the end portion. This mechanism will be described later. The high frequency current that have propagated along the metal surface of the upper electrode 105 flows through the processing chamber 100 to the ground.

Returning to FIG. 1, a second feeder line 155 split from the first feeder line 140 is connected to a second matcher 160 and a second high frequency power supply 165. A high frequency bias voltage having a frequency of, e.g., 3.2 MHz, outputted from the second high frequency power supply 165 is used for attracting ions into the lower electrode 110.

An exhaust port 170 is provided at a bottom surface of the processing chamber 100 and an exhaust device 175 connected to the exhaust port 170 is driven to maintain the interior of the processing chamber 100 at a desired vacuum state. Multi-pole ring magnets 180a and 180b are arranged around the upper chamber 100a. In the multi-pole ring magnets 180a and 180b, a plurality of anisotropic segment columnar magnets is attached to ring-shaped magnetic material casings and the magnetic pole of each anisotropic segment columnar magnet has an opposite direction of the magnetic pole of another anisotropic segment columnar magnet adjacent thereto. By doing so, magnetic force lines are formed between adjacent segment magnets and a magnetic field is only formed around the processing space between the upper electrode 105 and the lower electrode 110 so that plasma may be trapped within the processing space.

Figure 3A:
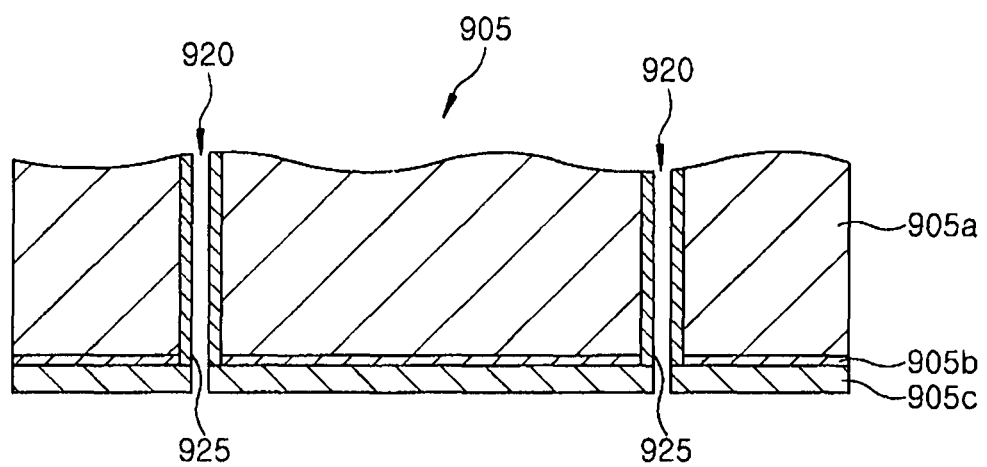
FIGS. 3A and 3B are a view illustrating gas holes of the apparatus and their peripheral areas.
Figure 3B:
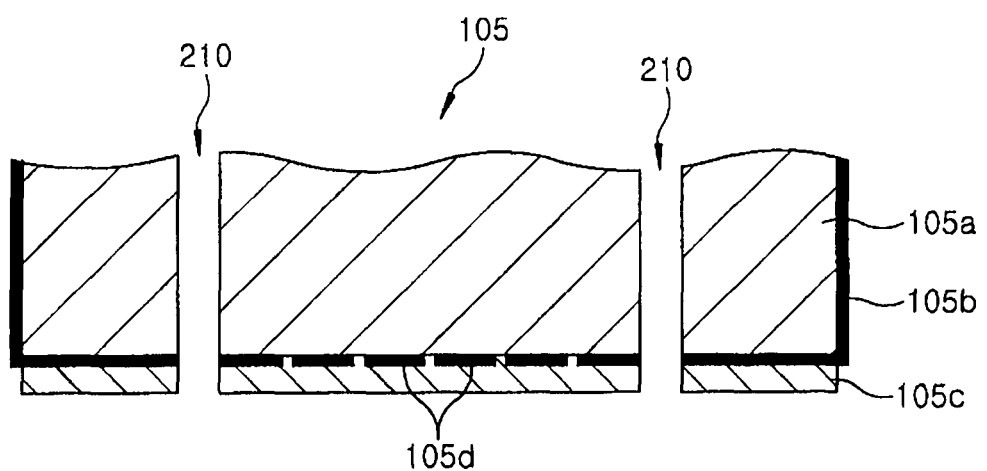

If the base 905a of the electrode 905 is made of a metal, e.g., aluminum as shown in FIG. 3A, the inner wall surfaces of the gas holes 920, which are aluminum metal surfaces, are exposed to the plasma. Then, the electric field is focused on the metal surfaces, which may cause abnormal discharge around the gas holes 920. To prevent this, there is a need of providing a sleeve 925 made of a dielectric material, such as alumina, in the gas hole 920 when the base 905a is made of a metal. This leads to increase in number of parts and costs. On the other hand, in the construction of the upper electrode 105 according to the embodiment, the dielectric base 105a is exposed through the inner wall surfaces of the gas hole 210 but the metallic backside surfaces are not exposed as shown in FIG. 3B. This prevents the occurrence of abnormal discharge. Accordingly, it is unnecessary to place an additional sleeve in the gas hole, thus saving costs.

Figure 4:
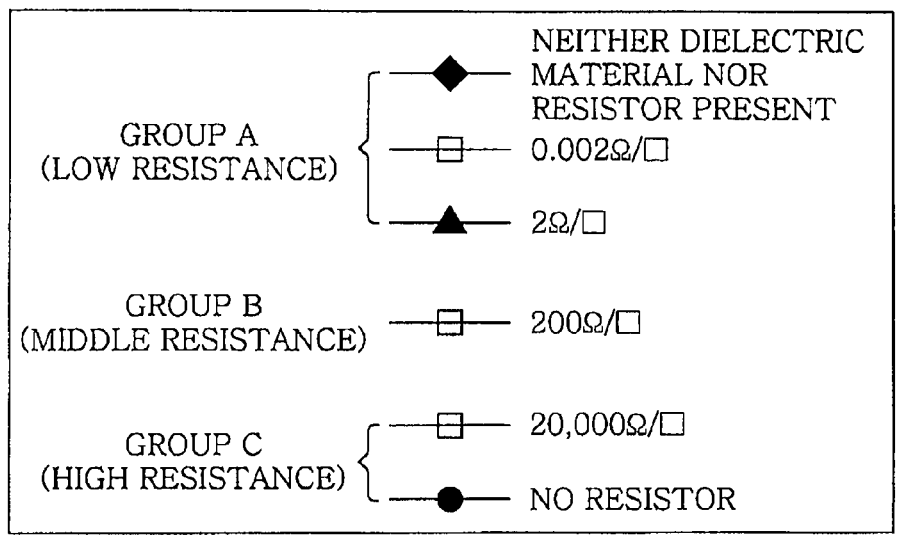
FIG. 4 is a graph illustrating an electric field strength distribution depending on the resistance of a resistor.
Figure 4:
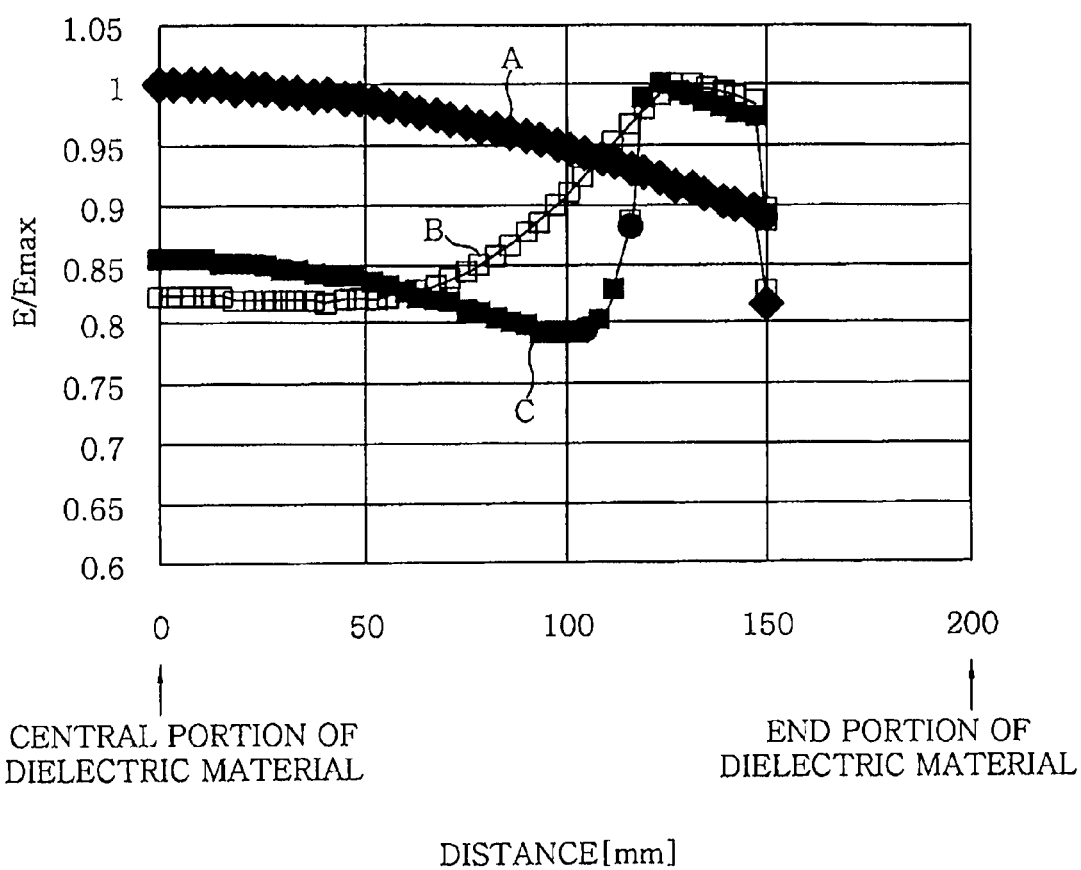
Figure 5A:
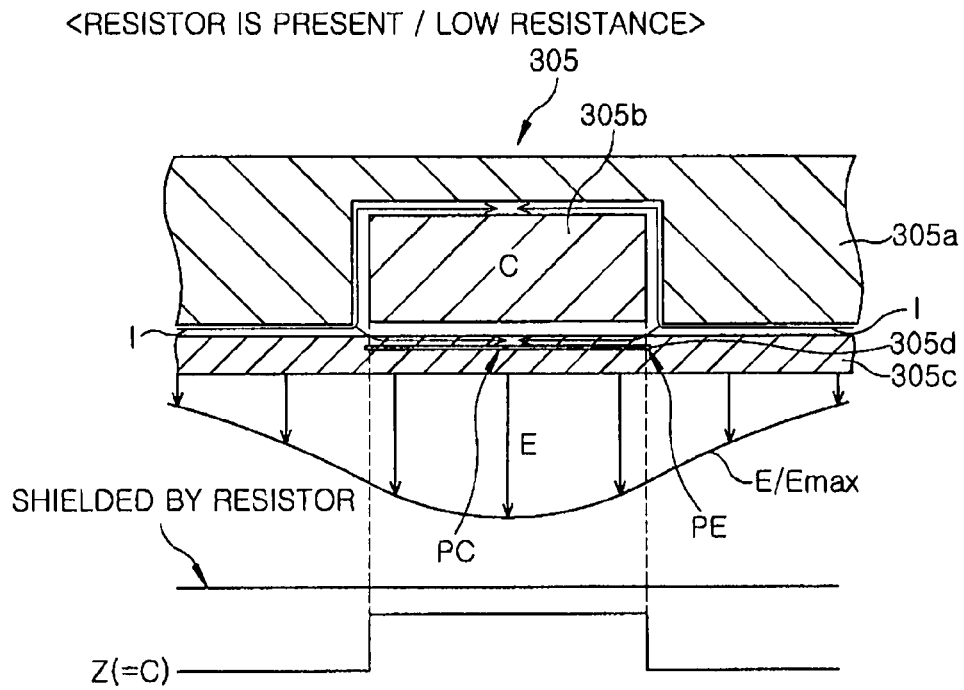
FIG. 5A is a view illustrating an electric field strength distribution in a case where there is provided a resistor with a low resistance.

(2) Relationship between the Resistor and an Electric Field Strength Distribution Prior to describing functions of the dielectric base 105b and the first resistor 105d as provided in the upper electrode 105, the control of electric field strength distribution using a dielectric material and a resistor will be described with reference to FIG. 4 and FIGS. 5A, 5B, and 5C. Referring to FIG. 5A, a dielectric material 305b is buried in a metallic base 305a. A sheet-shaped, metallic resistor 305d is buried in a dielectric cover 305c in the vicinity of the plasma side surface of the dielectric material 305b. In this case, the resistor 305d has the following effects on electric field strength distribution at the bottom portion of the upper electrode 105. FIG. 4 depicts a simulation result made by the inventors to prove this situation. As a simulation condition, the resistivity ρ of plasma was set 1.5 Ωm throughout the overall simulations. Further, the frequency of high frequency power as supplied was set 100 MHz unless otherwise mentioned. And, the sheet resistance of a resistor is represented as resistance per unit area Ω/□ of a sheet type resistor.

First, the inventors made simulations on a case where neither the dielectric material 305b nor the resistor 305d is present (FIG. 17A), a case where the resistor 305d has a low resistance (0.002 Ω/□, 2 Ω/□), a case where the resistor 305d has a middle resistance (200 Ω/□), and a case where the resistance 305d has a high resistance (20,000 Ω/□).

(2-1) In a Case that Neither a Dielectric Nor a Resistor are Present

There will be described an electric field strength distribution in case of an electrode (FIG. 17A) that includes neither the dielectric material 305b nor the resistor 305d. Hereinafter, the electric field strength distribution is represented as E/Emax when the maximum value of an electric field strength under each condition is Emax. As is apparent from the simulation results on the case where neither dielectric material nor resistor are present which belongs to group A in FIG. 4, the electric field strength distribution E/Emax at the bottom portion of the upper electrode 900 becomes dense at its central portion with respect to the high frequency current flowing from the end portion of the upper electrode 900 to the central portion.

(2-2) In a Case that the Resistor is Absent

In a case where the dielectric material 915 is only provided without the resistor (FIG. 17B), the electric field strength distribution E/Emax is lowered at the central portion of the upper electrode 900 compared to the case where neither dielectric material nor resistor is present. This is why when the high frequency current flows along the metal surface of the upper electrode 900, a voltage divider occurs due to the capacitance component by the dielectric material 915 provided at the central portion of the upper electrode 900 and the sheath capacitance component and high frequency electric field strength is distributed over the bottom portion of the dielectric material.

Figure 16:
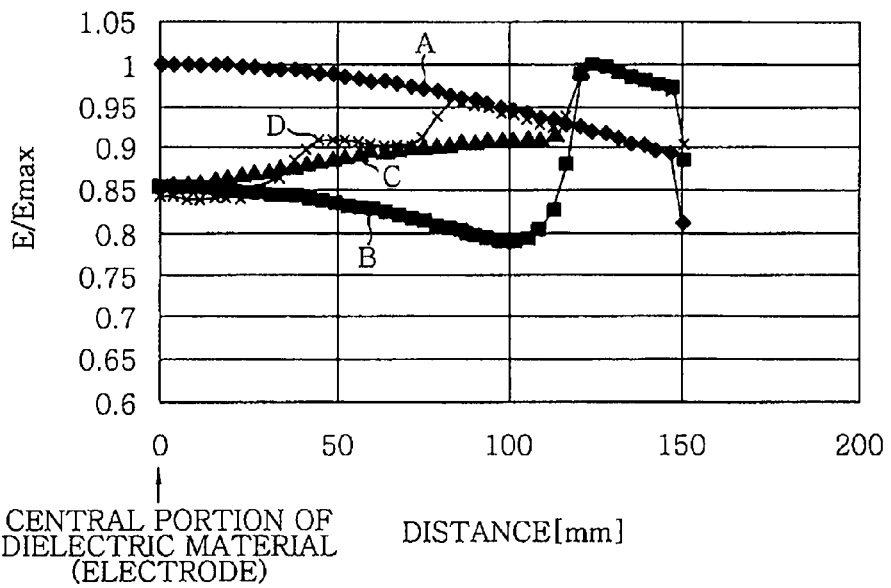
FIG. 16 is a view and a graph illustrating an electric field distribution where the shape of the dielectric material has been changed according to the prior art.
Figure 16:
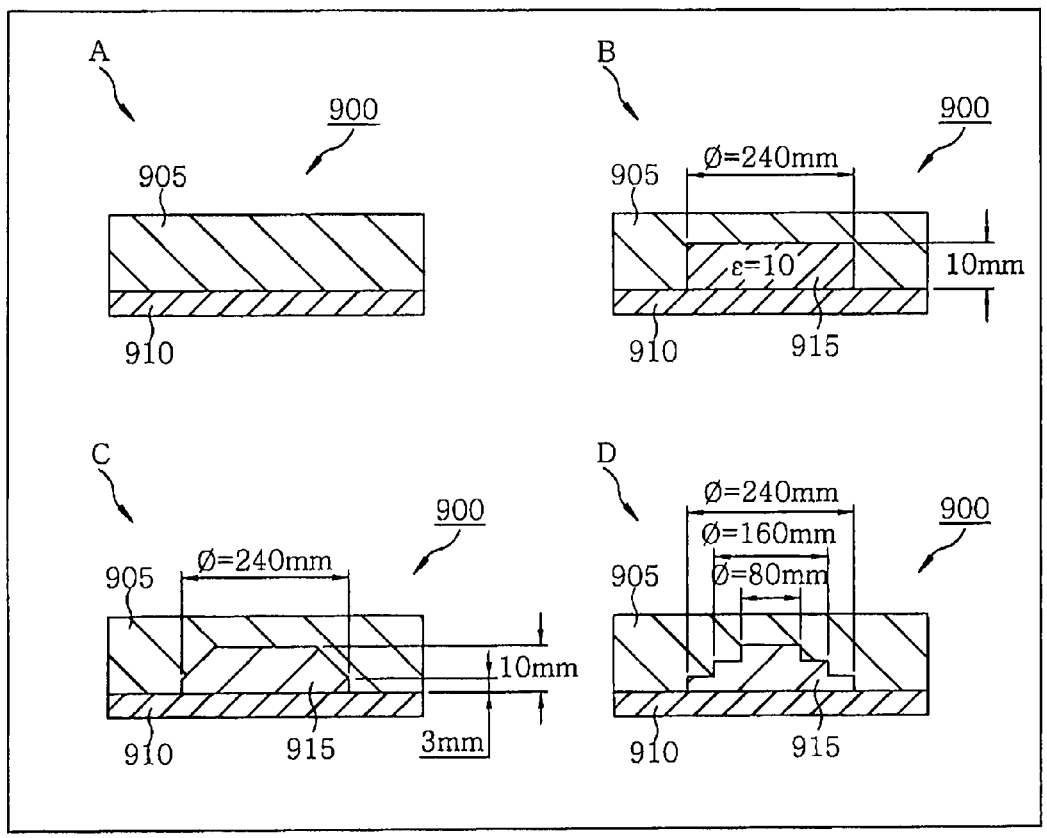
Figure 17A:
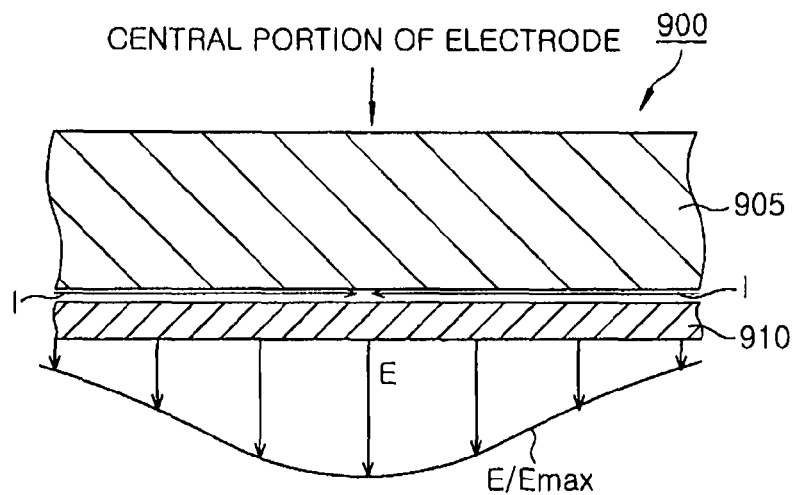
FIG. 17A is a view illustrating an electric field strength distribution where neither a dielectric material nor a resistor is provided according to the prior art.

It has been already developed and well known in the art to make the dielectric material tapered in order to improve the electric field strength distribution as shown in FIG. 16C. In this case, uniformity in electric field strength distribution E/Emax from the end portion of the upper electrode 900 toward the central portion of that was improved as shown in FIG. 17C. This result is considered to be obtained because the capacitance component C was further increased at the end portions of the dielectric material 915 than at the central portions of that and thus, a uniform distribution was obtained without the electric field strength distribution E/Emax being excessively lowered at the end portions of the dielectric material 915, as compared to the case where a flat dielectric material 915 is provided.

However, if the dielectric material 915 is formed in the tapered shape, thermal expansion difference of the dielectric material is increased respective of the aluminum base, stress is focused on the mating surface, and discrepancy in heat conductivity due to discrepancy in dimensional tolerance occurs at the mating interface, thus causing contamination at the gap of the mating surface. Further, difference between the dielectric material surface and the metal surface leads to difference in adhering property of spray and this peels off the sprayed material. This may be a cause of contamination in the chamber and lower production yield. Accordingly, the inventors buried the resistor 305d in the dielectric cover 305c in addition to the flat-shaped dielectric material 305b instead of making the dielectric material 915 tapered. The operation and effects of the resistor 305d will now be described.

(2-3) In a Case that the Resistor Has a Low Resistance

As shown in the simulation result in FIG. 4, a case where the resistor 305 has a low resistance (0.002 Ω/□, 2 Ω/□) belongs to group A similarly to the case where neither dielectric material nor resistor are present. In this case, as shown in FIG. 5A, the high frequency current I flows along the metal surface of the base 305a of the upper electrode 105 from the end portion toward the central portion. At the same time, the high frequency current I flows along the metal surface of the resistor 305d from the end portion toward the central portion.

The distance from the metal surface of the base 305a to the end portion of the resistor 305d is smaller than the skin depth of the high frequency power. The skin depth refers to a depth of the skin through which most of the high frequency current passes among the surface portions of a conductive material. Accordingly, if the gap between the base 305a and the resistor 305d is smaller than the skin depth as in this embodiment, the high frequency current I may flow along the surface of the resistor 305d. On the other hand, if the gap exceeds the skin depth, the high frequency current I may not flow along the surface of the resistor 305d. And, the skin depth is defined as the following equation:

$$\delta = (2/\omega\sigma\mu)^{1/2}$$

where, $\omega = 2\pi f$ (f: frequency), $\sigma$: conductivity, $\mu$: permeability It is considered that since the resistor 305d has a low resistance, the resistor 305d is substantially equipotential at both the central position PC and end position PE and the amount of current flowing along the metal surface of the resistor 305d is approximately equal to the amount of current flowing along the metal surface of the base 305a. As a consequence, as viewed from the plasma side, it appears that the base 305a and the resistor 305d are integrated to each other and the dielectric material 305b is not existent. That is, because the dielectric material 305b is shielded by the resistor 305d, it is impossible to lower the high frequency electric field strength distribution E/Emax by the capacitance component of the dielectric material 305b and thus the distribution becomes the electric field strength distribution E/Emax similar to the case where neither the dielectric material 305b nor the resistor 305d are present (FIG. 17A).

(2-4) In a Case that the Resistor Has a Middle Resistance

Figure 5B:
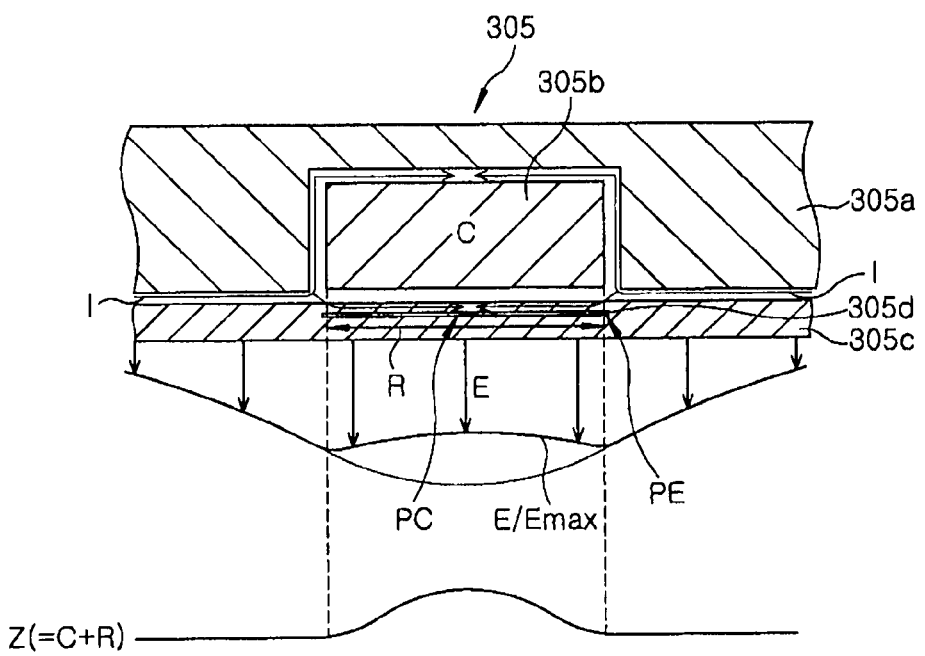
FIG. 5B is a view illustrating an electric field strength distribution in a case where there is provided a resistor with a middle resistance.

On the other hand, the simulation result in FIG. 4 showed a case where the resistor 305d has a middle resistance (200 Ω/□) belongs to group B identical to the case where a tapered dielectric material is present (FIG. 17C). In this case, as shown in FIG. 5B, the high frequency current I flows along the metal surface of the base 305a of the upper electrode 105 from the end portion toward the central portion. At the same time, the high frequency current I flows along the metal surface of the resistor 305d from the end portion toward the central portion.

Here, the resistor 305d has a middle resistance. Accordingly, a potential difference occurs between the central position PC of the resistor 305d and the end position PE and part of the high frequency energy is converted into Joule heat and consumed due to the resistance R of the resistor 305d while the current flows through the resistor 305d, and a potential distribution occurs due to the current and resistor. Accordingly, in a case where the resistor 305d has a middle resistance, the high frequency electric field strength distribution E/Emax may be gradually decreased.

That is, it is possible to make the impedance Z (=C+R) at the central portion of the upper electrode 105 gradually larger than the impedance Z (=C) at the end portion of the upper electrode 105 by providing a patterned metallic resistor only at a portion desired to control the impedance. The larger the impedance is at the electrode side, the lower the electric field energy may be consumed by plasma. This allows the electric field strength distribution E/Emax to be uniform at both the central portion and the end portion of the upper electrode 105 as shown in FIG. 5B. Consequently, even without any tapered dielectric material, plasma with uniform electron density Ne may be generated by using the dielectric material 305b and the resistor 305d similarly to the case of using a tapered dielectric material.

(2-5) In a Case that the Resistor Has a High Resistance

Figure 5C:
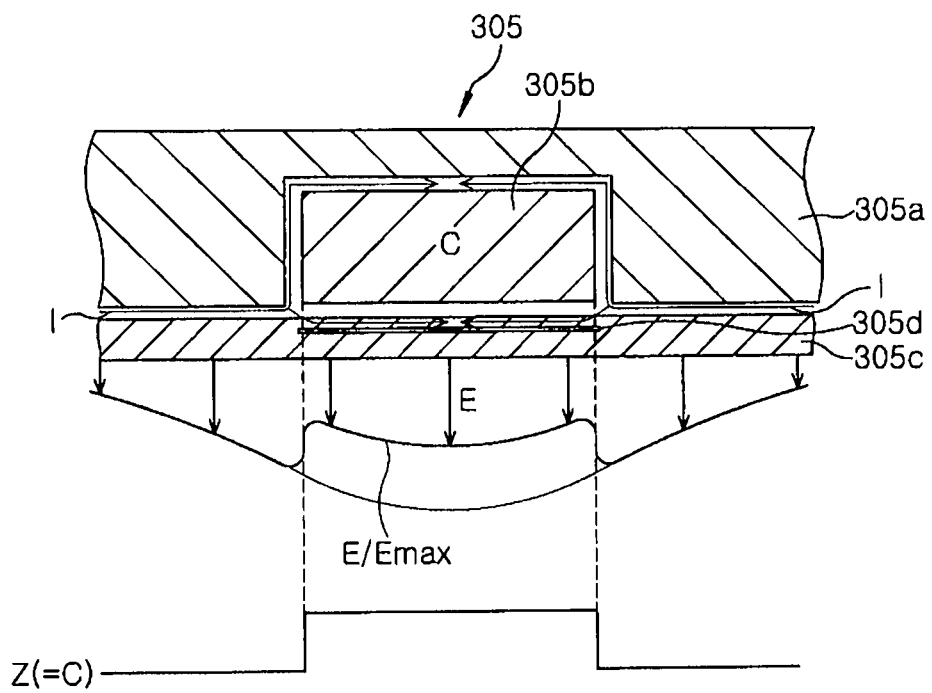
FIG. 5C is a view illustrating an electric field strength distribution in a case where there is provided a resistor with a high resistance.
Figure 17B:
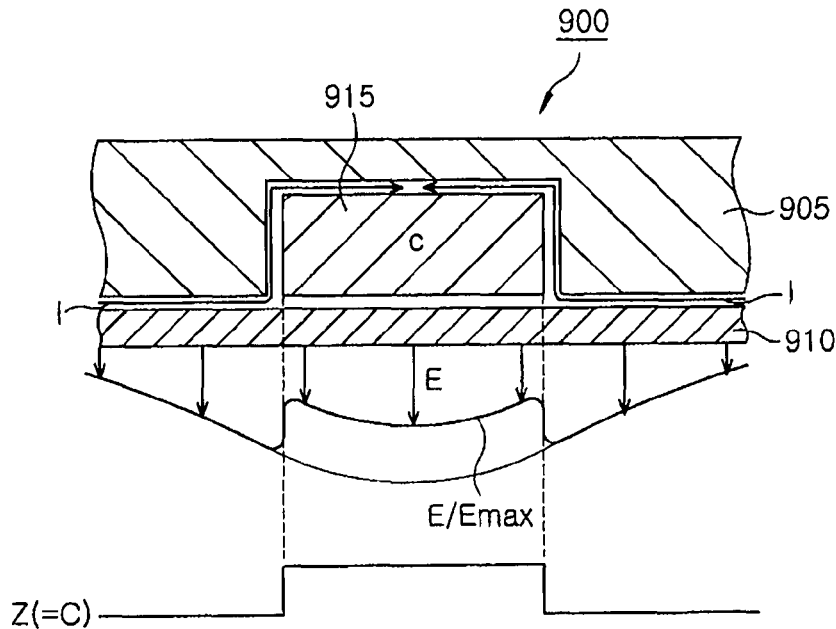
FIG. 17B is a view illustrating an electric field strength distribution where a dielectric material is only provided without a resistor according to the prior art.
Figure 17C:
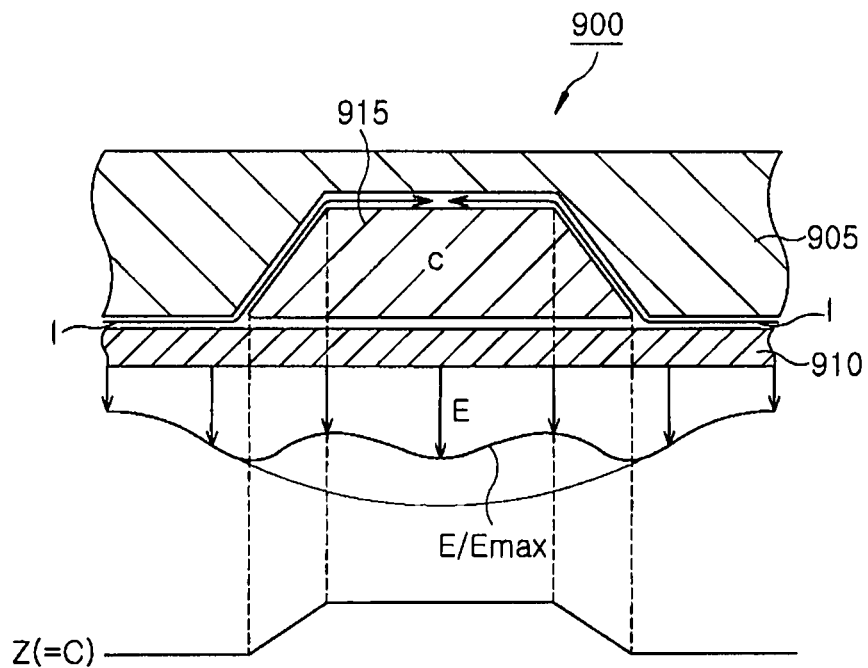
FIG. 17C is a view illustrating an electric field strength distribution where a tapered dielectric material is only provided without a resistor according to the prior art.

The simulation result in FIG. 4 showed a case where the resistor 305d has a high resistance (20,000 Ω/□) belonged to group C identically to the case where a dielectric material is provided without any resistor (FIG. 17B). In this case, as shown in FIG. 5C, the high frequency current I flows along the metal surface of the base 305a of the upper electrode 105 from the end portion toward the central portion. Since the resistor 305d has a high resistance, however, the resistor 305d serves as an insulation material so the high frequency current I does not flow along the metal surface of the resistor 305d. Resultantly, as viewed from the plasma side, it appears that the capacitance component C of the dielectric material 305b is only existent and the electric field strength distribution E/Emax is lowed at the central portion and nonuniform at the end portion similarly to the case where the dielectric material is only provided as shown in FIG. 17B.

From the above results, it can be seen that it could be preferred to select the sheet resistance of the resistor 305d as any one among 20 Ω/□~2000 Ω/□ which is higher than the low resistance 2 Ω/□ and less than 20000 Ω/□. In the upper electrode 105 according to the embodiment, from the above results, there is provided the first resistor 105d with middle resistance at the bottom portion of the dielectric base 105a. Further, the first resistor 105d has a metallic pattern at only a portion desired to control the impedance.

(3) Relationship between the Shape and a Combination of Resistors and an Electric Field Strength Distribution Next, the inventors performed simulations on how the shape or a combination of resistors affects the electric field strength distribution in order to optimize a proper shape or combination of the resistor.

(3-1) In a Case that the First Resistor (Patterned Resistor) is Provided

Figure 6A:
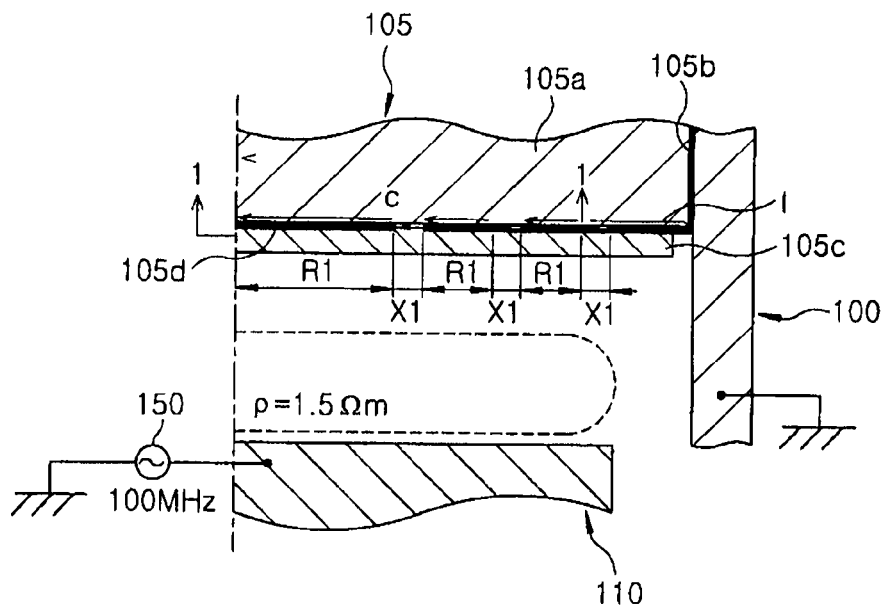
FIG. 6A is a view illustrating an electric field strength distribution in a case where a patterned resistor is provided and FIG. 6B is a graph illustrating an electric field strength distribution in a case where a patterned resistor is provided.
Figure 7A:
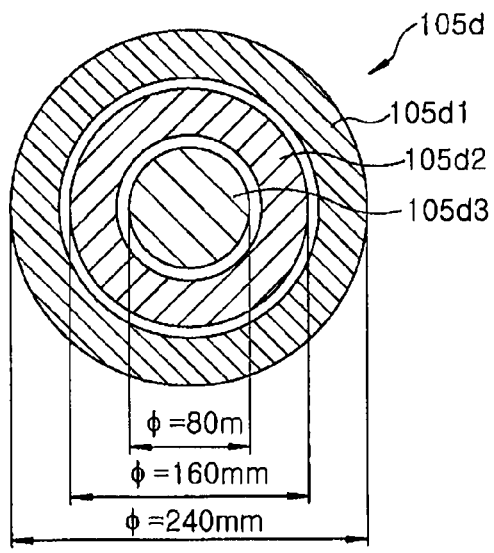
FIGS. 7A to 7C are views illustrating an exemplary pattern of a resistor.

First, the inventors patterned the first resistor 105d as shown in FIG. 6A and FIG. 7A. The cross section taken along line 1-1 in FIG. 6A corresponds to a right half of FIG. 7A. The first resistor 105d is divided into three ring shaped members. The outermost ring shaped member 105d1 has a diameter Ø of 240 mm, the middle ring shaped member 105d2 a diameter Ø of 160 mm, and the innermost circular shaped member 105d3 a diameter Ø of 80 mm. The members are equi-spaced by a predetermined distance from each other. The predetermined equal distance is set so that its impedance 1/Cω is larger than resistance R of the first resistor 105d.

Figure 6B:
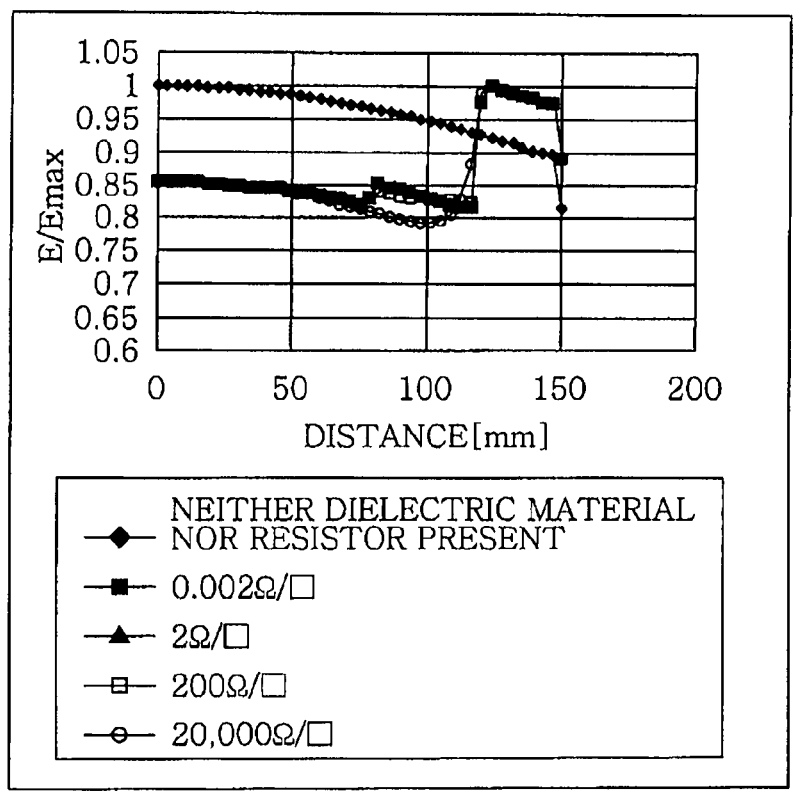

The simulation result in FIG. 6B showed a case where the first resistor 105d has a low resistance (0.002 Ω/□, 2 Ω/□) or a middle resistance (200 Ω/□) provided an electric field strength distribution similar to a case where the dielectric material 915 having such steps as shown in FIG. 16D is provided. As viewed from the plasma side, there appear the capacitance component C of the exposed portion of the base 105a, the resistance component R1 of the first resistor 105d, and the reactance component X1 occurring between metals in the first resistor 105d, whereby the electric field strength distribution E/Emax at the central portion of the upper electrode 105 is lowered, thus making the overall electric field strength distribution uniform as shown in FIG. 6B while generating uniform plasma. In a case where the first resistor 105d has a high resistance (20,000 Ω/□), nonuniformity in electric field strength distribution E/Emax occurred near the end portion of the first dielectric material 105b rather than in a case where the first resistor 105d has a low or middle resistance.

Figure 7B:
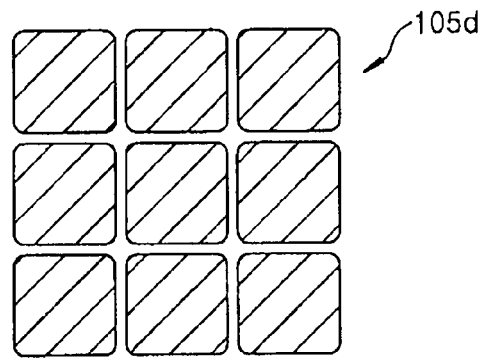
Figure 7C:
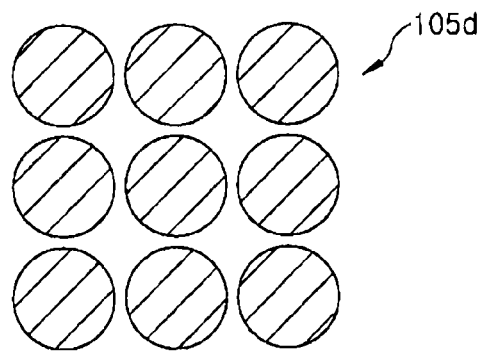

Further, instead of being formed as the plurality of ring-shaped members spaced from one another by the predetermined distance as shown in FIG. 7A, the first resistor 105d may be formed as a plurality of island-shaped members each being substantially shaped as a square and spaced from the others by a predetermined distance as shown in FIG. 7B, or as a plurality of island-shaped members each being shaped as a circle and spaced from the others by a predetermined distance as shown in FIG. 7C. In either case, the predetermined equal distance is set so that its impedance 1/Cω is larger than resistance R of the first resistor 105d.

Figure 8A:
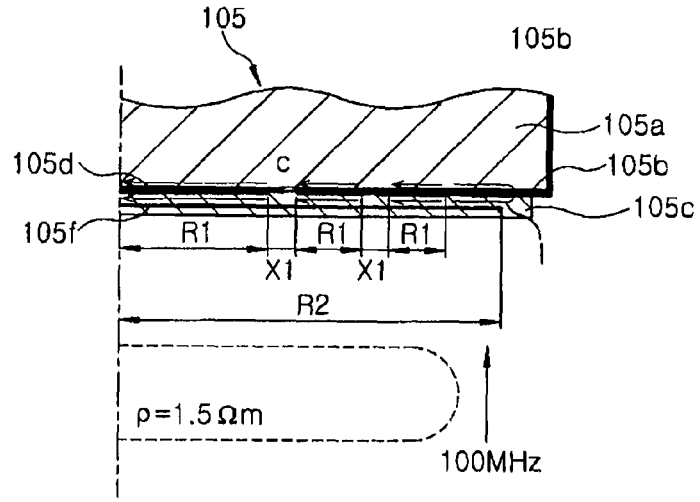
FIG. 8A is a view illustrating an electric field strength distribution in a case where there are provided a first resistor (patterned resistor) and a second resistor (integrated resistor) and FIG. 8B is a graph illustrating an electric field strength distribution in a case where there are provided a first resistor (patterned resistor) and a second resistor (integrated resistor)

(3-2) In a Case that the First Resistor and the Second Resistor (Integrated Resistor) are Provided In addition to the first resistor 105d separated in three ring-shaped members, the inventors provided an integrated (sheet type) second resistor 105f between the first dielectric material 105b and plasma as shown in FIG. 8A. Although it has been illustrated in FIG. 8A that the second resistor 105f is buried in the dielectric cover 105c under the first resistor 105d, the second resistor 105f may be buried in the dielectric cover 105c over the first resistor 105d. The second resistor 105f may also be provided in tight contact with the plasma-side surface of the dielectric cover 105c while being exposed from the dielectric cover 105c.

In a case where the second resistor 105f has a low resistance (0.01 Ωm), as shown in FIG. 8A, there appear the capacitance component C of the exposed portion of the base 105a, the resistance component R1 of the first resistor 105d, the reactance component X1 by the gap of the first resistor 105d, and the resistance component R2 of the second resistor 105f as viewed from the plasma side. As shown in the upper graph in FIG. 8B, it may be possible to gradually lower the electric field strength distribution E/Emax at the central portion of the upper electrode 105.

Figure 8B:
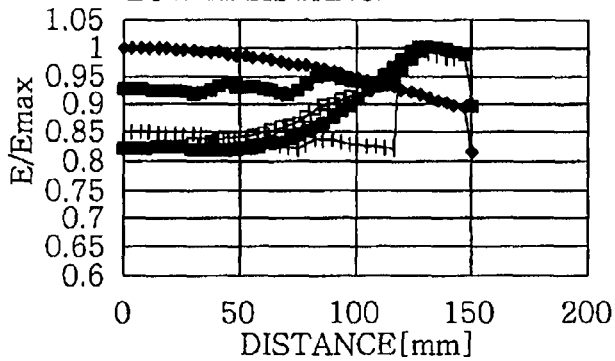
Figure 8B:
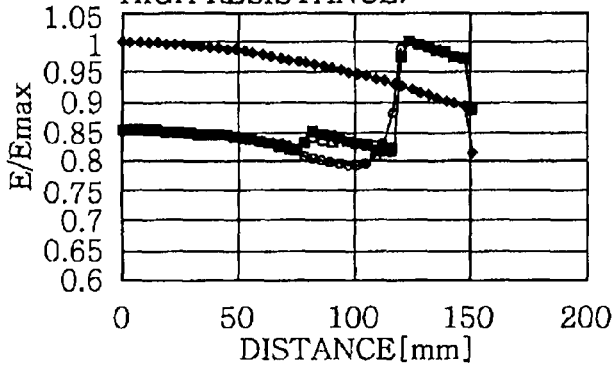

As shown in the lower graph in FIG. 8B, even in a case where the second resistor 105f has a high resistance (1 Ωm), it may be possible to make the entire distribution uniform by lowering the electric field strength distribution E/Emax at the central portion of the upper electrode 105. If the second resistor 105f is high in resistance, the resistance component R2 is high and accordingly, the second resistor 105f may be considered as an insulation material as viewed from the plasma side as compared to a case where the second resistor 105f is low in resistance. Further, the second resistor 105f may be constituted by a plurality of combinations of low resistances and high resistances.

In providing the integrated second resistor 105f between the base 105a and plasma in addition to the first resistor 105d, the total sheet resistance of the first resistor 105d and the second resistor 105f may be set to be greater than the low resistance (2 Ω/□) and smaller than the high resistance (20000 Ω/□), e.g., somewhere between 20 Ω/□ and 2000 Ω/□.

Figure 9A:
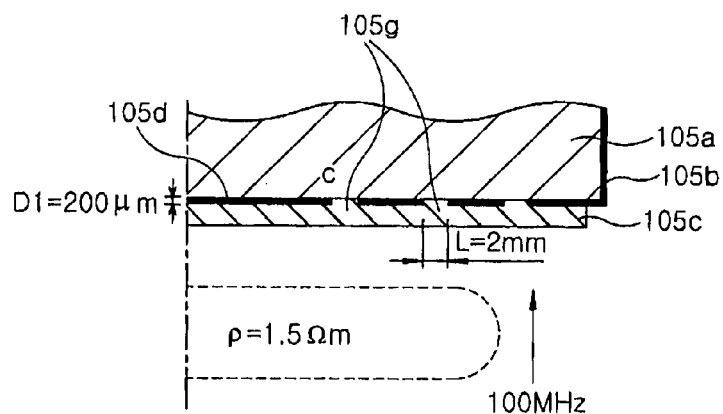
FIG. 9A is a view illustrating an electric field strength distribution in a case where there are provided a first resistor and a third resistor (joint resistor) and FIG. 9B is a graph illustrating an electric field strength distribution in a case where there are provided a first resistor and a third resistor (joint resistor)

(3-3) In a Case that the First Resistor and a Third Resistor (Joint Resistor) are Provided (3-3-1) Electric Field Strength Distribution Depending on Changes in a Frequency A variation with a frequency in electric field strength distribution E/Emax will now be described in using an electrode obtained by combining a first resistor and a third resistor (joint resistor). As shown in FIG. 9A, the inventors further provided a third resistor 105g at each gap between the three separated members of the first resistor 105d, in addition to the three separated ring-shaped members of the first resistor 105d. In another word, the third resistor 105g is provided at each joint between the three separated ring-shaped members of the first resistor 105d to connect therebetween.

Figure 9B:
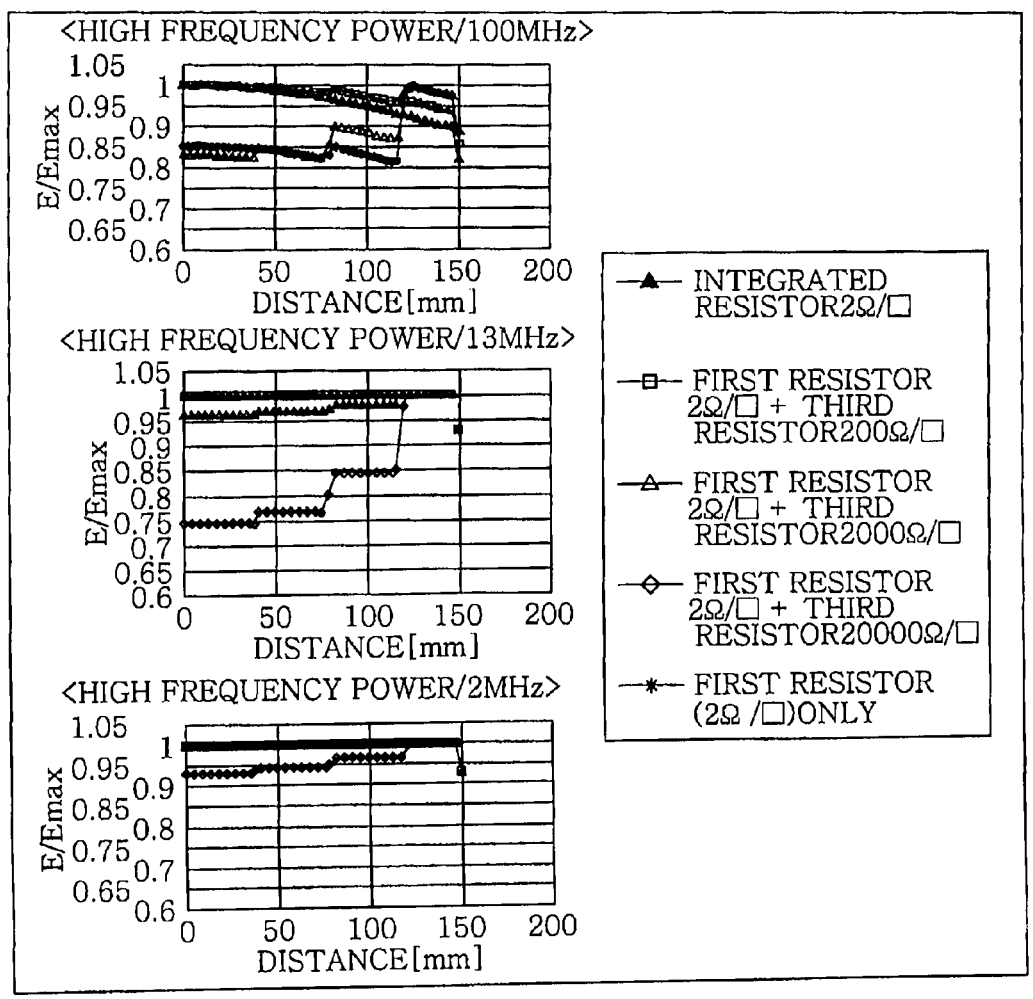

As conditions, the first resistor 105d was formed to have separated ring-shaped or circular members, with a width D1 of 200 μm and diameters Ø of 160 mm, 240 mm and 80 mm, and a resistance of 2 Ω/□. And, the third resistor 105g was set to have resistances of 200 Ω/□, 2000 Ω/□, and 20000 Ω/□. A simulation was made on each case and its results were shown in FIG. 9B. In FIG. 9B, there is shown a respective case where the frequency of high frequency power supplied from the first high frequency power source 150 for plasma excitation is 100 MHz, 13 MHz, and 2 MHz.

Referring to FIG. 9B, as the frequency increases from 2 MHz through 13 MHz to 100 MHz, the electric field strength distribution E/Emax tends to be lowered at the central portion of the upper electrode 105. This tendency is not changed even though the resistance of the third resistor 105g varies from 200 Ω/□ through 2000 Ω/□ to 20000 Ω/□. Specifically, while the capacitance is represented as 1/jωC and depends on the frequency (ω=2πf), the resistance R is not frequency dependent. Accordingly, the impedance Z, due to the capacitance component C of the dielectric material 305b, is reduced as the frequency is increased. On the other hand, the resistance R is constant regardless of the frequency. Thus, as the frequency is increased, the entire impedance Z in frequency characteristic is decreased and a high frequency current is prone to flow through the first resistor 105d and the third resistor 105g. According to the result in FIG. 9B, as the third resistor 105g is higher in resistance, the electric field strength is lowered due to the capacitance C and the resistance R and the electric field strength distribution E/Emax is lowered at the central portion of the upper electrode 105. Further, as the frequency becomes higher, a high frequency current flows through the first and third resistors, which leads to lowering in electric field strength, and although the resistance of the third resistor 105g is lowered, the electric field strength distribution E/Emax is lowered at the central portion of the upper electrode 105, thus capable of making the distribution uniform over the bottom portion of the electrode.

(3-3-2) Electric Field Strength Distribution of Resistors with a Difference in Thickness (First and Third Resistors)

Figure 10A:
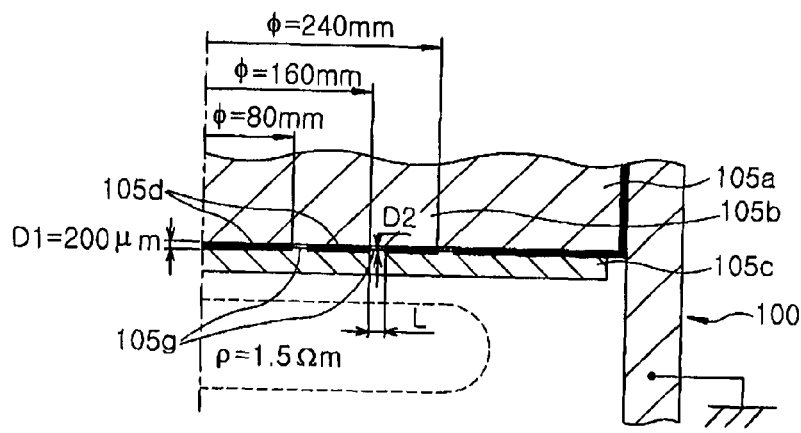
FIG. 10A is a view illustrating an electric field strength distribution in a case where the thickness of the third resistor is varied while the first resistor is 0.5 Ωne and frequency is 100 MHz

Next, as shown in FIG. 10A, the inventors performed simulation based on changes in width L (gap) between the three ring-shaped members of the first resistor 105d as well as changes in thickness D2 of the third resistor 105g. As conditions for this simulation, the first resistor 105d was set to have ring-shaped members with a width D1 of 200 μm and diameters Ø of 160 mm, 240 mm, and a circular shaped member with a width D1 of 200 μm and a diameter Ø of 80 mm, and a resistance of 0.5 Ω/□. The frequency of the high frequency power was 100 MHz. A thickness of the third resistor 105g was set to vary from 0.1 mm through 0.05 mm to 0.01 mm.

Figure 10B:
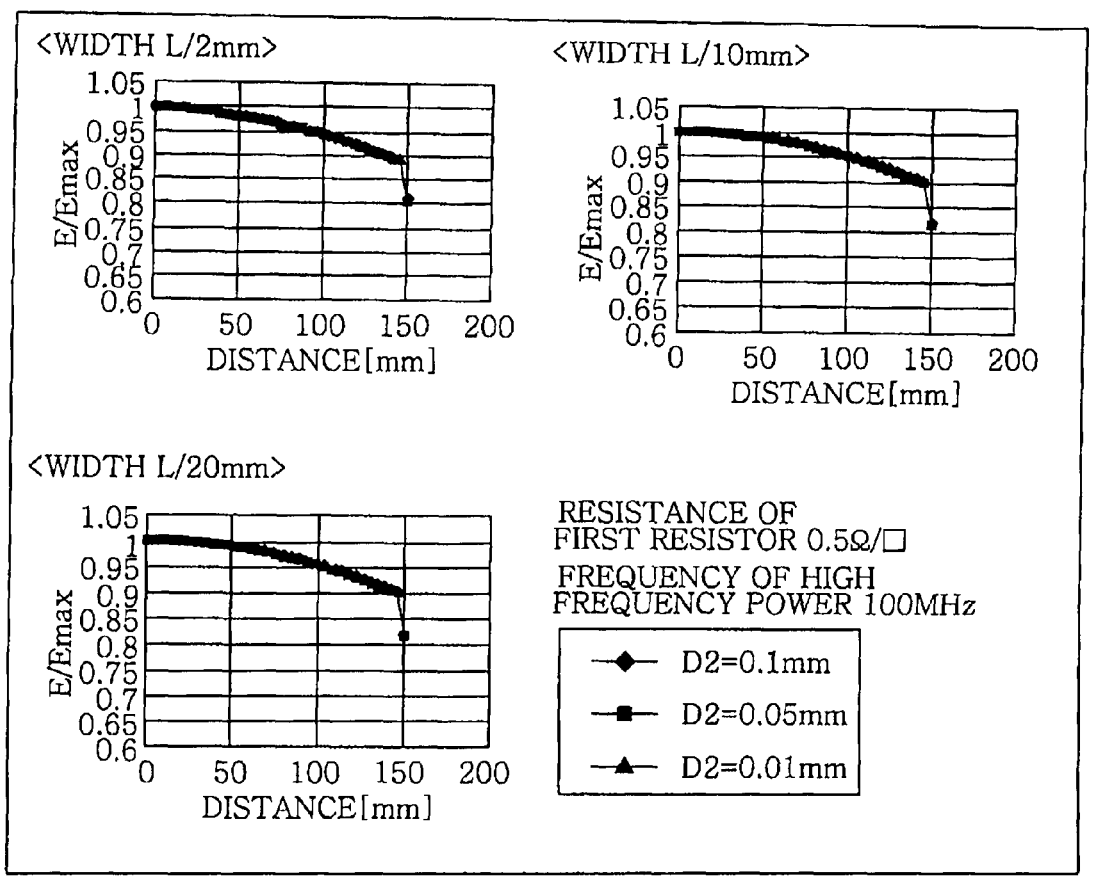
FIG. 10B is a graph illustrating an electric field strength distribution in a case where the thickness of the third resistor is varied while the first resistor is 0.5 Ω/□ and frequency is 100 MHz.

A result was shown in FIG. 10B. From top to bottom, the graphs in FIG. 9B depicts where the width L of the first resistor 105d is 2 mm, 10 mm, and 20 mm, respectively. They show that in any case, there was no lowering in electric field strength distribution E/Emax at the central portion of the upper electrode 105 and it was impossible to make the electric field strength distribution E/Emax uniform at the bottom portion of the electrode.

The inventors changed only the resistance of the first resistor 105d to 5 Ω/□ under the same construction as introduced for the simulation in FIG. 10A. The frequency of the high frequency power was set to 100 MHz and the thickness D2 of the third resistor 105g was set to 0.1 mm, 0.05 mm, and 0.01 mm.

Figure 11:
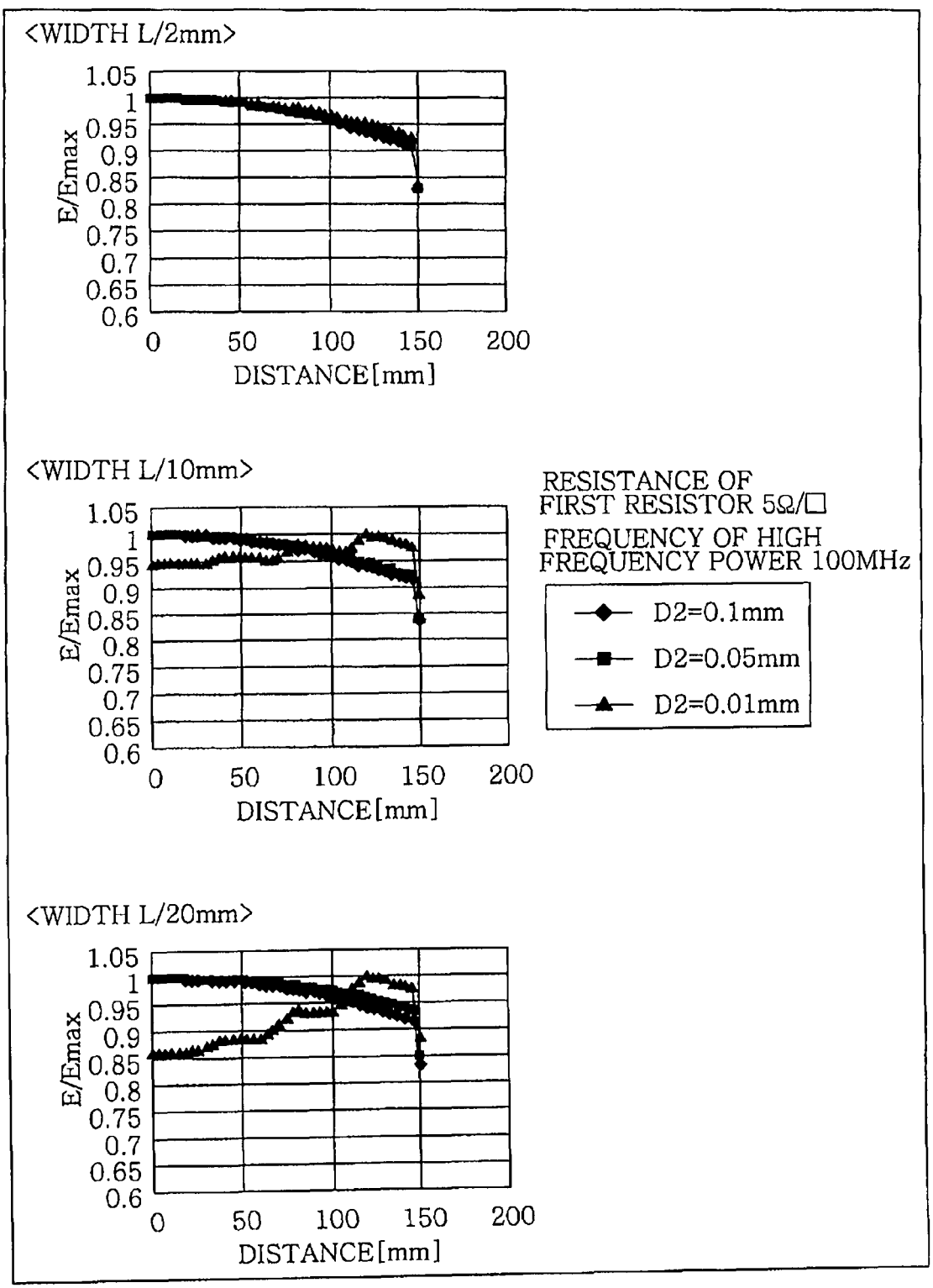
FIG. 11 is a graph illustrating an electric field strength distribution in a case where the thickness of the third resistor is varied while the first resistor is 5 Ωs and frequency is 100 MHz.

A result of the above simulation is depicted in FIG. 11. FIG. 11 shows that in a case where the width L is 2 mm, the electric field strength distribution E/Emax was not lowered at the central portion of the upper electrode 105. On the other hand, when the width L is 10 mm and 20 mm, the electric field strength distribution E/Emax was lowered at the central portion of the upper electrode 105 as the third resistor 105g has thinner thickness.

Further, the inventors changed only the resistance of the first resistor 105d to an even higher resistance of 50 Ω/□ under the same configuration. The frequency of the high frequency power was set to 100 MHz and the thickness D2 of the third resistor 105g was set to 0.1 mm, 0.05 mm, and 0.01 mm.

Figure 12:
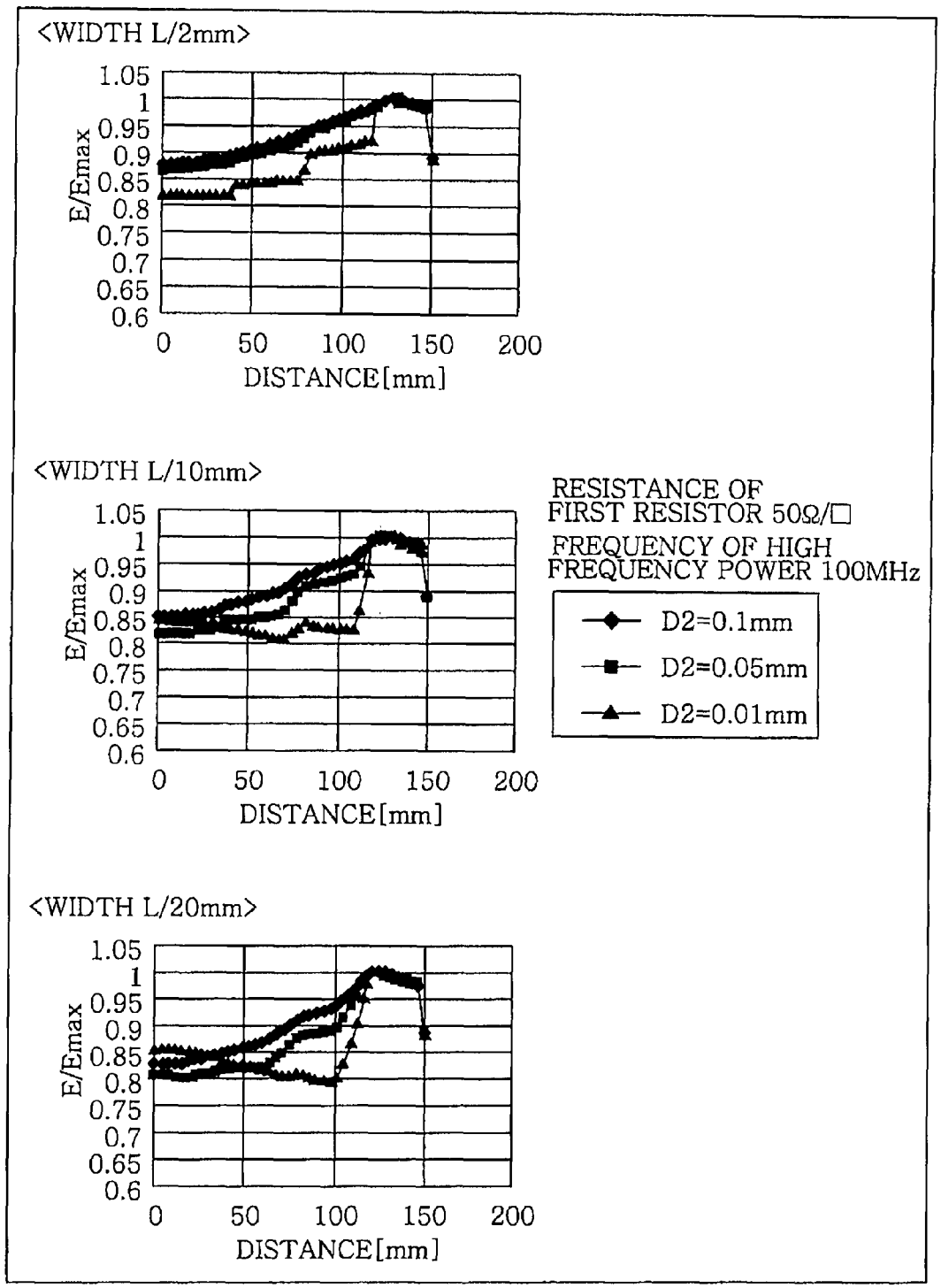
FIG. 12 is a graph illustrating an electric field strength distribution in a case where the thickness of the third resistor is varied while the first resistor is 50 Ωf and frequency is 100 MHz.

A result of the above simulation is depicted in FIG. 12. FIG. 12 shows that in any case where the width L is 2 mm, 10 mm, and 20 mm, the electric field strength distribution E/Emax was lowered at the central portion of the upper electrode 105. As the third resistor 105g had thinner thicknesses, this tendency became noticeable.

Next, the inventors changed the resistance of the first resistor 105d to 5 Ω/□ and the frequency of the high frequency power to 13 MHz, and set the thickness D2 of the third resistor 105g to 0.1 mm, 0.05 mm, and 0.01 mm, under the same construction.

Figure 13:
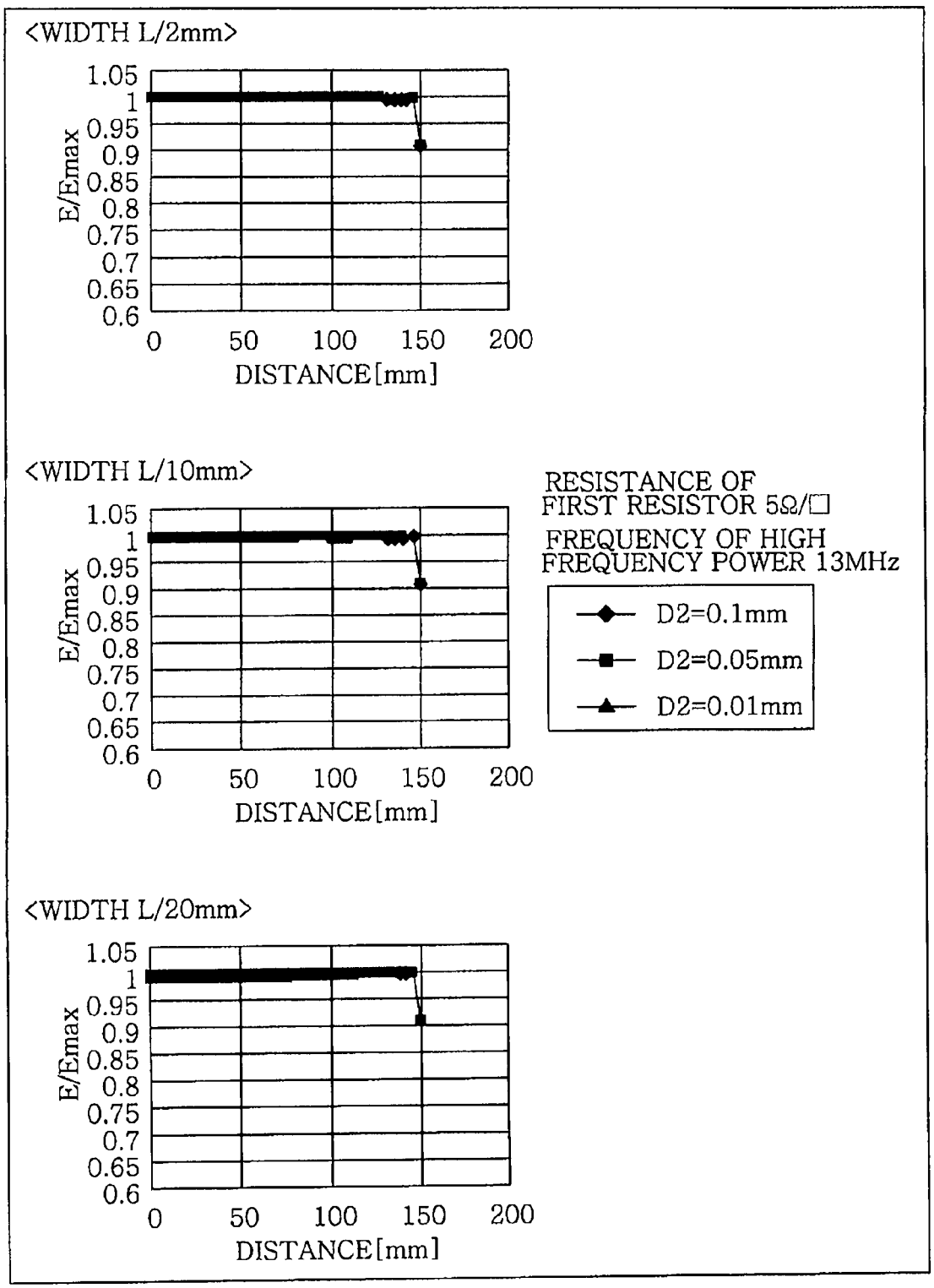
FIG. 13 is a graph illustrating an electric field strength distribution in a case where the thickness of the third resistor is varied while the first resistor is 5 Ωelectric field strength MHz.

A result of the above simulation is depicted in FIG. 13. This shows that in any case where the width L is 2 mm, 10 mm, and 20 mm, the electric field strength distribution E/Emax was not lowered at the central portion of the upper electrode 105 and thus the electric field strength distribution E/Emax was not uniform at the bottom portion of the electrode.

Thus, the inventors changed the resistance of the first resistor 105d to an even higher resistance, i.e., 50 Ω/□ and set the frequency of the high frequency power to 13 MHz, and the thickness of the third resistor 105g to 0.1 mm, 0.05 mm, and 0.01 mm, under the above configuration.

Figure 14:
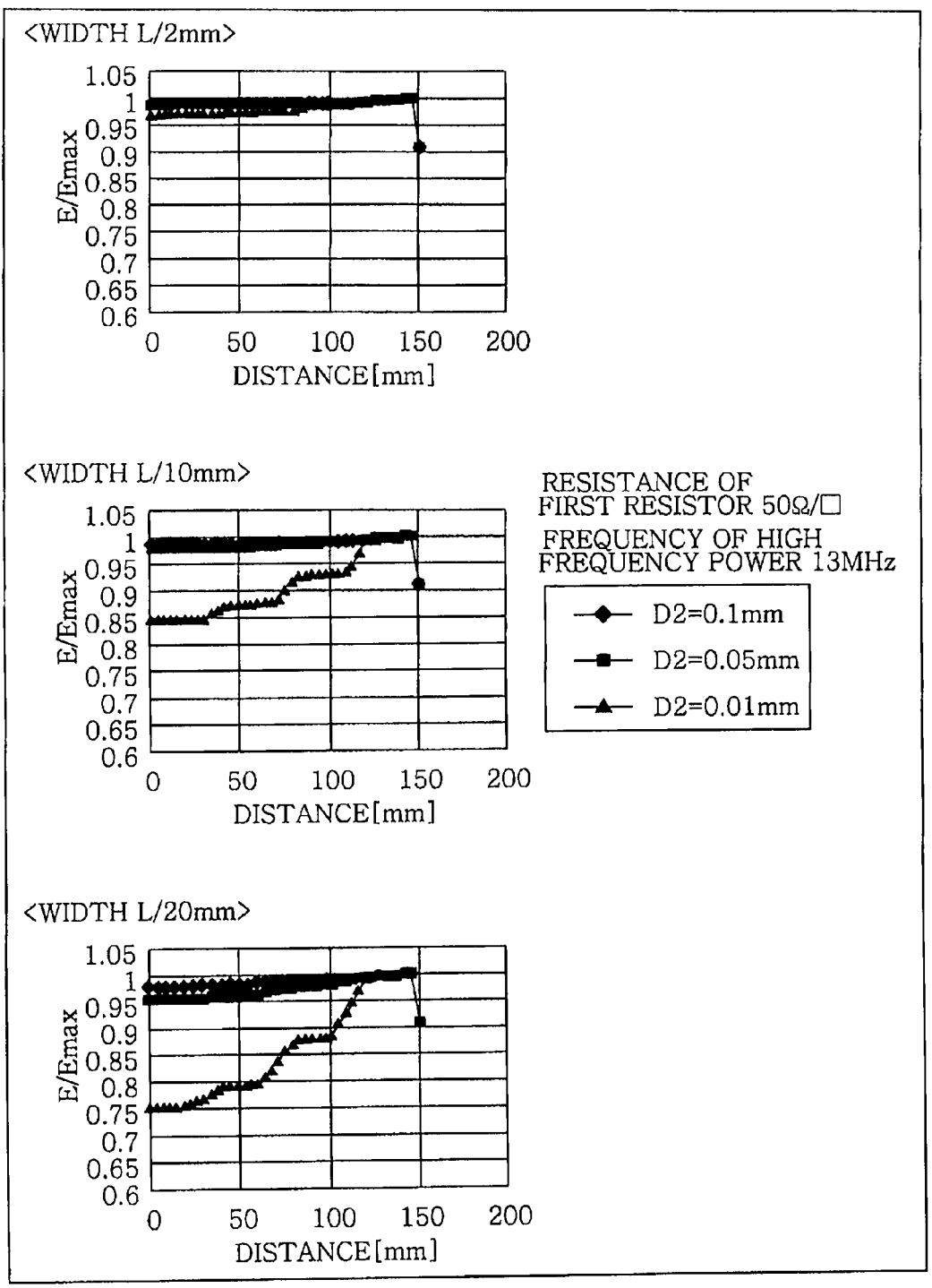
FIG. 14 is a graph illustrating an electric field strength distribution in a case where the thickness of the third resistor is varied while the first resistor is 50 where the thickness is MHz.

A result of the above simulation is shown in FIG. 14. FIG. 14 shows that as the width L increases, the electric field strength distribution E/Emax is lowered at the central portion of the upper electrode 105 and the electric field strength distribution E/Emax was uniform at the bottom portion of the electrode.

From the above results, in a case where the high frequency power whose frequency ranges from 13 MHz to 100 MHz is applied to the apparatus, while the sheet resistance of the first resistor 105d is simultaneously set in the range from 5 Ω/□ to 50 Ω/□, the predetermined distance between the ring-shaped members of the first resistor 105d may be within a range of 10 mm to 20 mm.

(3-4) In a Case that the First Resistor Has an Opening at its Central Portion

Figure 15A:
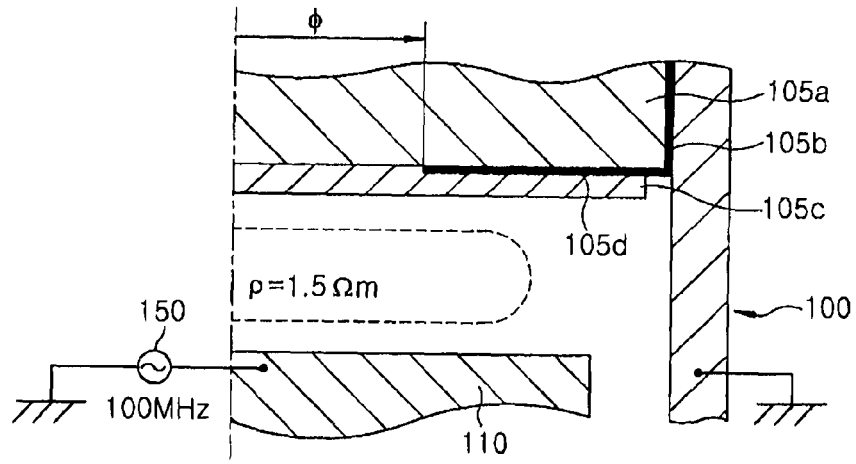
FIG. 15A is a view illustrating an electric field strength distribution where the first resistor has an opening at its central portion and FIG. 15B is a graph illustrating an electric field strength distribution where the first resistor has an opening at its central portion.
Figure 15B:
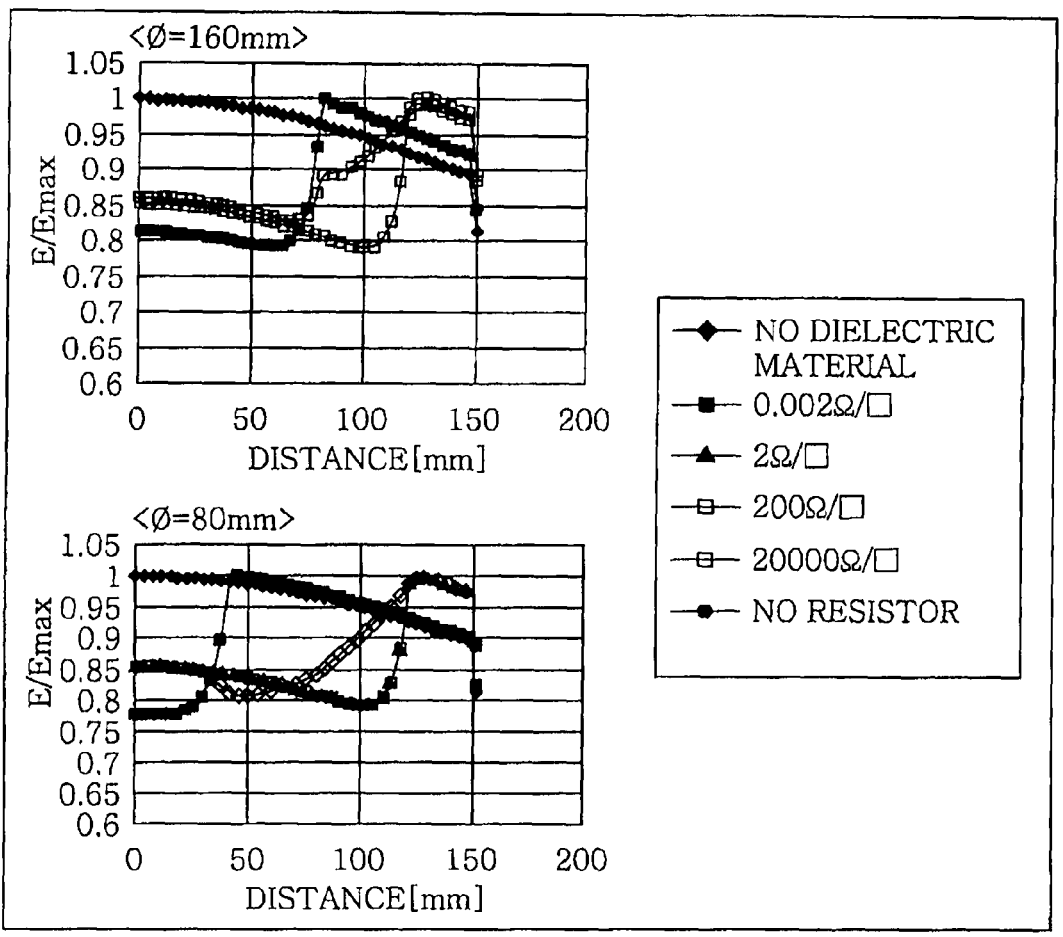

Next, the inventors performed simulation on a case where the first resistor 105d is a single ring-shaped member with an opening at its central portion as shown in FIG. 15A. As conditions for this simulation, the diameter Ø of the opening at the central portion of the first resistor 105d was set to 160 mm and its resistance was set to 0.002 Ω/□, 2 Ω/□, 200 Ω/□, and 20,000 Ω/□. Further, the frequency of the high frequency power was set to 100 MHz. A result of the simulation is depicted in FIG. 15B. FIG. 15B shows that the electric field strength distribution E/Emax was lowered at the upper electrode near the opening, depending on the diameter of the opening of the first resister 105d.

The inventors performed a simulation on a case where the diameter Ø of the central opening of the first resistor 105d was changed to 80 mm. The result also showed that the electric field strength distribution E/Emax was lowered at the upper electrode 105 near the opening, depending on the diameter of the opening of the first resistor 105d. It could be seen from the result shown in FIG. 15B that the same effects as the case where the dielectric material 305b is provided with steps or tapered portions may be achieved by adjusting the diameter of the opening included in the metal resistor (the first resistor 105d).

In the electrode according to the above embodiment, as described above, the sheath electric field generated on the plasma side surface of the upper electrode 105 may be affected by the capacitance of the portion of the base 105a as exposed from the first resistor 105d and the resistance of a singularity or polarity of resistors, thus capable of lowering the electric field strength distribution E/Emax for generating plasma.

(4) Modified Embodiment

Figure 19:
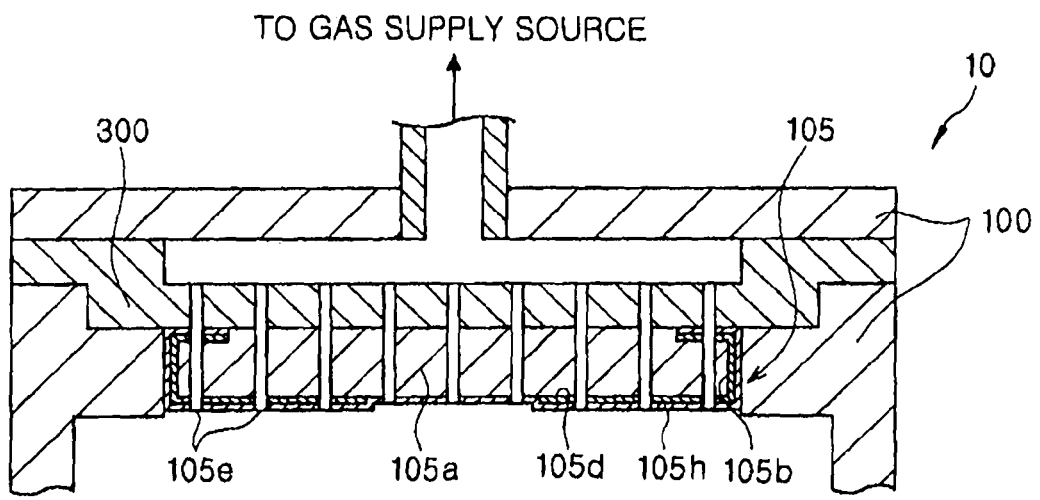
FIG. 19 provides a vertical cross sectional view of an RIE plasma etching apparatus in accordance with a modification of the present invention.

Hereinafter, an RIE plasma etching apparatus in accordance with a modified embodiment of the present invention will be briefly described. FIG. 19 is a cross sectional view of an RIE plasma etching apparatus 20 in accordance with the modified embodiment. An upper electrode 205 includes an upper base 205a; and a gas diffusion portion (base plate of electrical conductor) 300 provided right above the upper base 205a and forming a shower head together with the upper base 205a. Namely, in the RIE plasma etching apparatus 20 of the modified embodiment, the upper electrode 205 is fixed to a ceiling surface of a processing chamber 200 via the gas diffusion portion 300. A gas is supplied from the gas supply source 115 and diffused in the gas diffusion portion 300. Next, the gas passes through a plurality of gas openings 205e of the upper base 205a from a plurality of gas passages formed at the gas diffusion portion 300 and is introduced into the processing chamber 200.

(Resistor Manufacturing Method)

Hereinafter, a method for manufacturing an electrically conductive cover 105b, a first resistor 105d and a second resistor 105f will be described and, then, a method for installing the upper electrode 105 will be described based on the structure of the RIE plasma etching apparatus 10 in accordance with the modification shown in FIG. 19.

FIG. 20A is a cross sectional view of the upper electrode 105 including the conductive cover 105b and the first resistor 105d which are formed together as a simple unit by thermal spraying. FIG. 20B is a cross sectional view of the upper electrode 105 including the conductive cover 105b, the first resistor 105d and the second resistor 105f which are formed by thermal spraying.

The upper electrode 105 shown in FIG. 20A is manufactured by following two steps.

(1) 1st step: Aluminum (Al) is thermally sprayed on an entire surface of the base 105a made of quartz (or alumina ceramic) having a thickness of about 10 mm except for a central portion of a bottom surface of the base 105a. The thermally sprayed aluminum (Al) functions as the conductive cover 105b and the first resistor 105d. For example, an opening having a diameter Φ of about 75 mm is formed at the central portion of the bottom surface of the base 105a.

(2) 2nd step: After performing the thermal spraying process of the first step, yttria having a high plasma resistance is thermally sprayed on the surface of the base 105a, thereby forming a thermally sprayed surface layer 105h. The thermally sprayed surface layer 105h has a thickness of about 100 to 200 μm.

The upper electrode 105 shown in FIG. 20B is manufactured by following three steps, where the upper electrode 105 shown in FIG. 20B is the modification of the upper electrode 105 shown in FIG. 20A.

(1) 1st step: Aluminum functioning as the conductive cover 105b and the first resistor 105d is thermally sprayed on an entire surface of the base 105a made of quartz (or alumina ceramic) having a thickness of about 10 mm except for the central portion of the bottom surface and the central portion of the top surface of the base 105a. An opening having a diameter Φ of, e.g., about 75 mm, is formed at the central portion of the bottom surface of the base 105a. Aluminum is thermally sprayed with a width of about 10 mm on the peripheral portion of the top surface of the base 105a. Aluminum is not thermally sprayed on the central portion of the top surface of the base 105a.

(2) 2nd step: After performing the thermal spraying process of the first step, titania.yttria ($TiO_2 \cdot Y_2O_3$) is thermally sprayed on the entire bottom surface of the base 105a. The thermally sprayed titania.yttria functions as the second resistor 105f. The titania.yttria has a thickness of, e.g., about 100 μm.

(3) 3rd step: After carrying out the thermal spraying process of the second step, yttria is thermally sprayed on the surface of the base 105a, thereby forming a thermally sprayed surface layer 105h. The thermally sprayed surface layer 105h has a thickness of about 100 to 200 μm. The central portion of the top surface of the base 105a which is not thermally sprayed with aluminum is not thermally sprayed with yttria.

In the above-described manner, the conductive cover 105b and the first resistor 105d can be formed by thermal spraying. The second resistor 105f can also be formed by thermal spraying. If the conductive cover 105b, the first resistor 105d and the second resistor 105f are formed by thermal spraying, a desired upper electrode 105 can be simply manufactured by minimum steps.

The upper electrode 105 of FIG. 20A can be simply remanufactured by peeling off the thermally sprayed surface layer 105h, the conductive cover 105b and the first resistor 105d in that order and then thermally spraying the conductive cover 105b, the first resistor 105d and the thermally sprayed surface layer 105h again in that order. The electrode of FIG. 20B can also be simply remanufactured by peeling off the thermally sprayed surface layer 105h, the second resistor 105f, the conductive cover 105b and the first resistor 105d and then thermally spraying them again.

A sheet resistance of the first resistor 105d may range from about $2 \times 10^{-4}$ Ω/□ to about 20 Ω/□. Further, a sheet resistance of the second resistor 105f may range from about 20 Ω/□ to about 2000 Ω/□. Preferably, the sum of the sheet resistance of the first resistor 105d and that of the second resistor 105f ranges from about 20 Ω/□ to about 2000 Ω/□.

The titania.yttria ($TiO_2 \cdot Y_2O_3$) functioning as the second resistor 105f is an example of a composite resistor containing titanium oxide. Another material containing titanium oxide may also be used.

In the example of FIG. 20A, the thermally sprayed surface layer 105h is thermally sprayed on the bottom surface of the upper base 105a uniformly. Therefore, the surface of the thermally sprayed surface layer 105h which faces the plasma is recessed at a portion where the first resistor 105d is not provided. Also in the example of FIG. 20B, the thermally sprayed surface layer 105h and the second resistor 105f are thermally sprayed on the bottom surface of the base 105a uniformly. Thus, the surface of the thermally sprayed surface layer 105h which faces the plasma is recessed at a portion where the first resistor 105d is not provided.

Figure 20C:
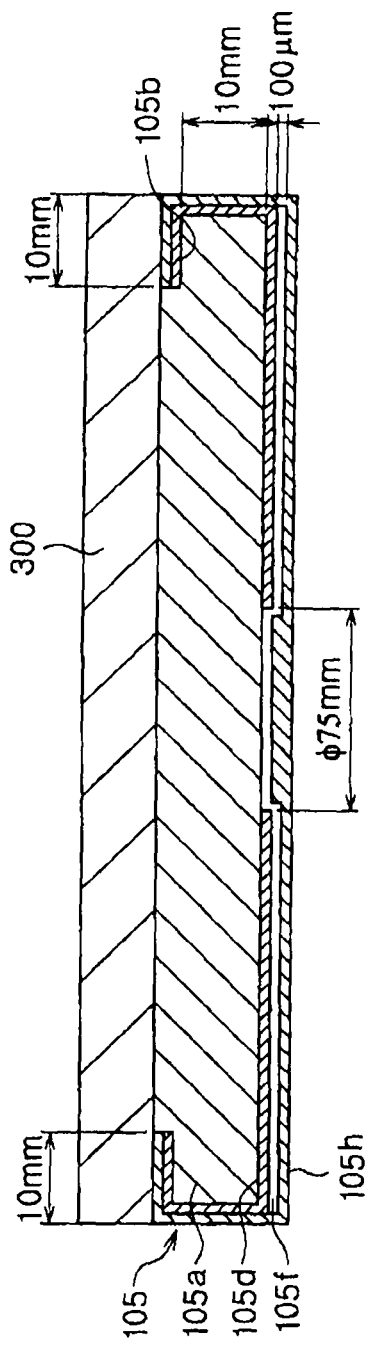

On the other hand, in the example of FIG. 20C, a thermally sprayed surface layer 105h is thermally sprayed with a thickness thicker by the thickness of the first resistor 105d at the portion where the first resistor 105d is not provided. As a consequence, the entire surface of the thermally sprayed surface layer 105h which faces the plasma becomes flat.

The top surface of the base 105a may be thermally sprayed with lamination of aluminum and the thermally sprayed surface layer 105h of yttria, or may be thermally sprayed with thermally sprayed aluminum only. Or, the base 105a may be exposed without thermally spraying aluminum and the thermally sprayed surface layer 105h of yttria.

The second resistor 105f may have a laminated structure of a layer having a high resistivity and a layer having a low resistivity. For example, the second resistor 105f of the above-described embodiment may be replaced with a laminated layer of high resistivity silicon carbide (SiC) having a resistivity of about $10^4$ Ω·cm and low resistivity carbon C having a resistivity of about $10^{-4}$ Ω·cm. In that case, a silicon carbide layer may be formed by CVD (Chemical Vapor Deposition), and a carbon layer may be formed by using a graphite sheet, a kapton tape or the like. Hence, the same effects as those of the above-described embodiment can be obtained.

FIGS. 20A to 20C and 21 are applied to the case where the top surface of the upper base 105a is adhered to the gas diffusion portion 300 shown in FIG. 19. However, when a gas diffusion space S is provided directly above the upper base 105a without arranging the gas diffusion portion 300 therebetween as shown in FIG. 1, aluminum (conductive cover 105b) needs to be thermally sprayed on the entire top surface of the upper base 105a as can be seen from FIG. 20A.

In the first embodiment (FIGS. 1 to 18) of the present invention, the conductive cover 105b and the first resistor 105d have been described as individual members. However, as described in the modified embodiment (see FIGS. 19 to 20C), the conductive member 105b and the first resistor 105d may be formed simultaneously by using the same material by thermal spraying of aluminum. Further, the conductive cover 105b and the first resistor 105d may be formed of tungsten, and in this case, they can be formed by thermal spraying. For example, in a case where the base 105a is formed of alumina ceramic, damage to the upper electrode 105 caused by the differences in heat expansion rate between the conductive cover 105b and the base 105a and between the first resistor 105d and the base 105a can be prevented more securely. This is because the difference in heat expansion rate between tungsten and alumina ceramic is relatively low as compared to that between aluminum and alumina ceramic.

(Method for Installing Electrode)

Figure 21:
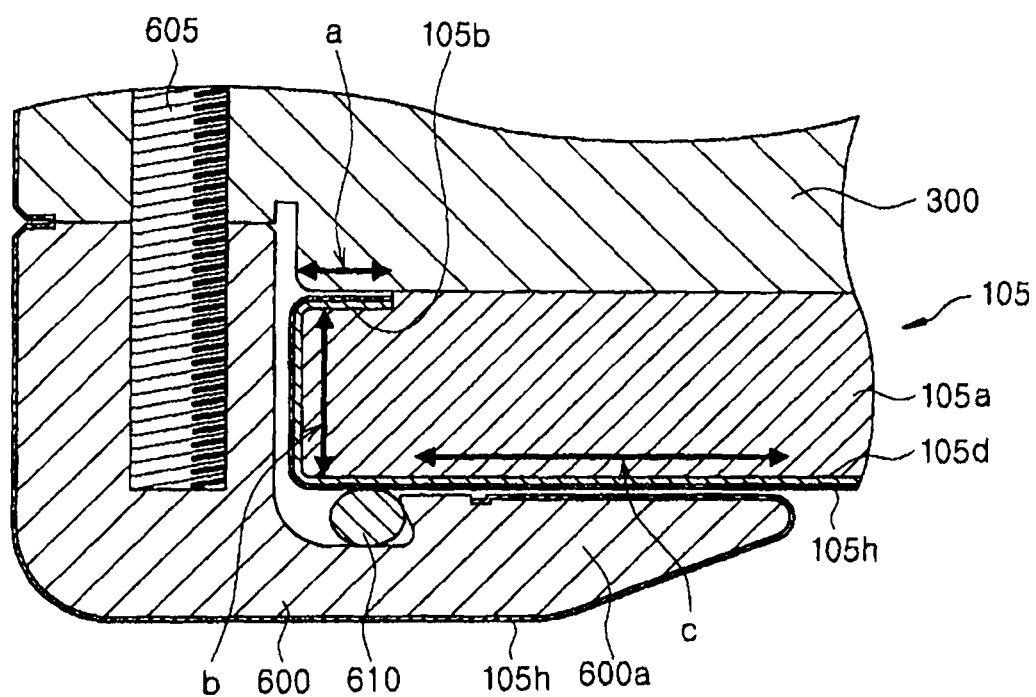
FIG. 21 is a cross sectional view showing peripheral components of a clamp for fixing the base from a peripheral side surface thereof.

Hereinafter, a method for installing the upper electrode 105 will be described with reference to FIG. 21. FIG. 21 is a cross sectional view showing a clamp 600 for fixing the upper electrode 105 at a peripheral surface side thereof and its surroundings.

In this embodiment, an L-shaped electrically conductive clamp 600 is provided at the peripheral surface side of the upper base 105a. The upper electrode 105 is firmly fixed to the gas diffusion portion 300 by using a spring ring (or coupling ring) 610 and a screw 605 for fixing the gas diffusion portion (base plate of conductor) 300 and the clamp 600. Accordingly, the first resistor 105d and the conductive cover 105b of the upper electrode 105 are positioned close to a top surface of a claw portion 600a of the clamp 600, a side surface of the clamp 600 and a portion of a bottom surface of the gas diffusion portion 300.

Hence, on the bottom surface of the gas diffusion portion 300, the conductive cover 105b and the gas diffusion portion 300 are coupled (electrically connected) to each other only at an area "a". Further, on the side surface of the upper base 105a, the conductive cover 105b and the gas diffusion portion 300 are coupled to each other at an area "b" due to the presence of the clamp 600. On the bottom surface of the base 105a, the first resistor 105d and the gas diffusion portion 300 are coupled (electrically connected) to each other only at an area "c". Therefore, even when a sufficient ground coupling area cannot be ensured between the top surface of the upper base 105a and the bottom surface of the gas diffusion portion 300, a sufficient ground coupling area as a whole can be obtained by using the clamp 600 and the coupling areas b and c.

Further, even if the ground coupling are is ensured by the clamp 600, the entire top surface of the upper base 105a can be used as the coupling area by thermally spray the entire top surface of the upper base 105a as shown in FIG. 20A. However, if the top surface of the base 105a is exposed as shown in FIG. 20B, a contact area between the thermally sprayed surface layer 105h and the gas diffusion portion 300 decreases and, thus, it is possible to decrease generation of dust caused by the contact between the thermally sprayed surface layer 105h and the gas diffusion portion 30.

The shape of the clamp 600 and the gap between the clamp 600 and the base 105a are not limited to the example illustrated in FIG. 21. For example, to increase an electrostatic capacitance C expressed by, $C = \in_r \cdot \in_o \cdot S/d$ ($\in_r$ being relative dielectric constant, $\in_o$ being dielectric constant of vacuum, S being area between clamp and electrode and d being distance between clamp and electrode), it is preferable to maximize the claw portion 600a of the clamp 600 or minimize the distance between the clamp 600 and the first resistor 105d.

The coupling areas "a" to "c" can be used even in the case of fixing by the clamp 600 the upper electrode 105 having the first resistor 105d and the second resistor 105f shown in FIG. 20B instead of the upper electrode 105 having the first resistor 105d shown in FIG. 20A.

Further, the upper electrode 105 can be fixed to the ceiling surface due to the reaction of the coupling ring 610 without directly transmitting the clamping force of the clamp 600 to the gas diffusion portion 300 or the ceiling. Moreover, the thermally sprayed surface layer 105h may be formed by thermally spraying yttria or the like on the surface of the clamp 600.

While the preferred embodiments of the present invention have been described with reference to the accompanying drawings, the present invention is not limited thereto. It will be understood by those skilled in the art that various changes and modifications may be made without departing from the scope of the invention as defined in the following claims.

Figure 18A:
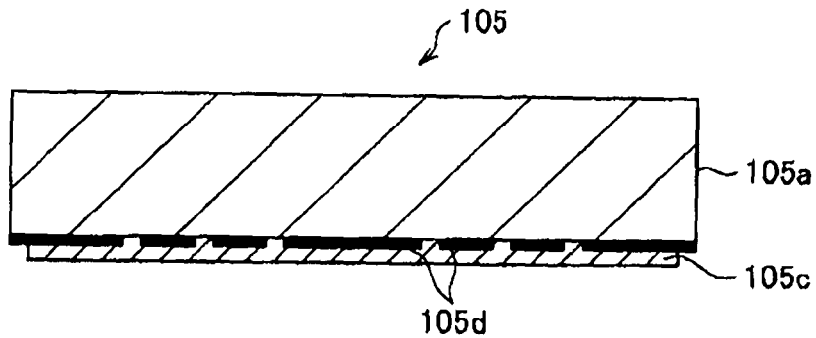
FIGS. 18A and 18B are views illustrating an exemplary variation to an electrode without a conductive cover.
Figure 18B:
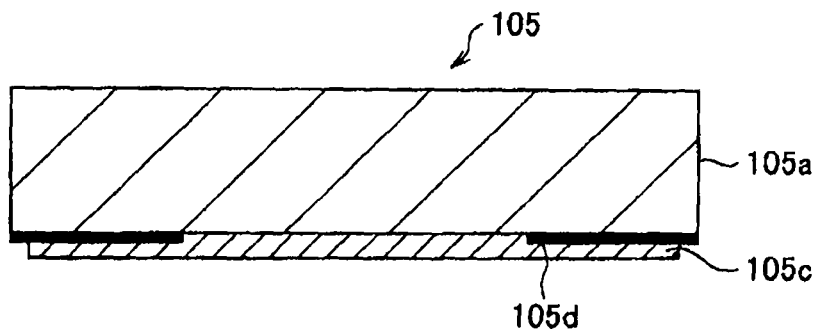

For example, the electrode according to the present invention, as shown in FIG. 18A, may include the base 105a, the dielectric cover 105c, and the patterned first resistor 105d. Further, the electrode may include the base 105a, the dielectric cover 105c, and the first resistor 105d having an opening at the central portion of the plasma side surface of the base 105a, as shown in FIG. 18B. In these cases, there is no conductive cover 105b and thus mechanical strength may be maintained by making the thickness of the base 105a or the dielectric cover 105c appropriate.

In the electrode according to the present invention, further, the first resistor may be provided between the base and the plasma and formed of a metal with a predetermined pattern. For example, the first resistor may be not buried in the dielectric cover but exposed at the plasma side.

Further, the resistor according to the present invention may be applied to the lower electrode or both the upper electrode and the lower electrode without being limited to the upper electrode. In this case, the second resistor as described above may also serve as an electrostatic chuck that electrostatically adsorbs the wafer W mounted on the lower electrode by applying a DC voltage to the electrode.

In a case where the first resistor is patterned, there may be provided at the gap a plurality of gas holes that pass through the electrode.

The target object may be a silicon wafer whose size is equal to or more than 200 mm or 300 mm, or a substrate whose size is equal to or more than 730 mm×920 mm.

What is claimed is:

1. A plasma processing apparatus comprising:
   a processing chamber in which a target object is processed by a plasma;
   a first and a second electrode that are provided in the processing chamber to face each other and wherein a processing space is between the first and second electrodes; and
   a high frequency power source that is connected to one of the first and the second electrodes to supply a high frequency power to the processing chamber, wherein at least one electrode of the first and the second electrodes includes:
   (a) a base formed of a plate-shaped dielectric material;
   (b) a resistor formed of a metal and provided between the base and the processing space, wherein the resistor includes a plurality of members that are each located at a position at which a high frequency electric field strength is to be lowered, and wherein the plurality of members are configured to reduce a degree of variation in high frequency electric field distribution on a plasma-facing side of the at least one electrode by converting, at each of the positions of the plurality of members, a current from the high frequency power to heat in order to lower the high frequency electric field strength at those positions; and
   (c) an additional resistor formed of a metal and located between the base and the processing space, wherein the additional resistor has a sheet resistance that causes a potential difference to occur between a central position of the additional resistor and an end position of the additional resistor when the current flows along the additional resistor, and wherein the sheet resistance of the additional resistor is in a range from about 20 Ω/☐ to about 2000 Ω/☐, and
   wherein the resistor and the additional resistor are located on two different vertical planes of the same electrode.

2. The plasma processing apparatus of claim 1, wherein the at least one electrode including the resistor further includes an electrically conductive cover which has an opening and covers at least a side surface of the base.

3. The plasma processing apparatus of claim 2, wherein the electrically conductive cover is grounded.

4. The plasma processing apparatus of claim 1, wherein the resistor is patterned.

5. The plasma processing apparatus of claim 1, wherein the at least one electrode including the resistor further includes a dielectric cover that covers the base at a side of the base facing the processing space, and the resistor is buried in the dielectric cover.

6. The plasma processing apparatus of claim 5, wherein the dielectric cover is formed by one of spraying, attaching a tape or a sheet-shaped member, ion plating, and plating.

7. The plasma processing apparatus of claim 1, wherein the resistor comprises a plurality of ring-shaped members spaced apart from one another by a predetermined distance therebetween or a plurality of island-shaped members spaced apart from one another by the predetermined distance therebetween.

8. The plasma processing apparatus of claim 7, wherein the predetermined distance is set so that its impedance $1/C\omega$ is larger than the resistance R of the resistor.

9. The plasma processing apparatus of claim 7, further comprising a third resistor thinner in thickness than the resistor and provided between the members of the resistor.

10. The plasma processing apparatus of claim 7, wherein the at least one electrode including the resistor is an upper electrode and gas holes are provided between the members of the resistor.

11. The plasma processing apparatus of claim 1, wherein the high frequency power connected to one of the first and second electrodes has a frequency ranging from about 13 MHz to about 100 MHz.

12. The plasma processing apparatus of claim 1, wherein the resistor is formed by thermal spraying.

13. The plasma processing apparatus of claim 12, wherein the additional resistor is formed by thermal spraying.

14. The plasma processing apparatus of claim 13, wherein the thermal spraying of the additional resistor is performed by using a composite resistor containing titanium oxide.

15. The plasma processing apparatus of claim 12, wherein the thermal spraying of the resistor is performed while leaving at least a part of a surface of the base which faces the processing space.

16. The plasma processing apparatus of claim 12, wherein the base is electrically connected to a clamp formed of an electric conductor fixing the base to the processing chamber and supporting the base at a peripheral side of the base.

17. The plasma processing apparatus of claim 12, wherein a sheet resistance of the resistor ranges from about $2 \times 10^{-4}$ $\Omega/\square$ to about $20$ $\Omega/\square$.

18. The plasma processing apparatus of claim 1, wherein the first electrode is an upper electrode and the second electrode is a lower electrode, and wherein the upper electrode includes the base and the resistor, and the resistor of the upper electrode is in contact with a surface of the base facing toward the processing space.

19. The plasma processing apparatus of claim 1, wherein the dielectric material is untapered.

20. An electrode for use in a plasma processing apparatus that generates a plasma of a gas by an applied high frequency power and performs a plasma processing on a target object by using the generated plasma, wherein the electrode is one of a first and a second electrode disposed to face each other with a plasma processing space therebetween, and wherein the electrode comprises:
(a) a face which faces the processing space when the electrode is positioned in the plasma processing apparatus,
(b) a base formed of a plate-shaped dielectric material, wherein the dielectric material is untapered;
(c) an electrically conductive cover that has an opening and covers the base; and
(d) a resistor formed of a metal and provided between the base and said face, such that the resistor is between the base and the processing space, wherein the resistor includes a plurality of members that are each located at a position at which a high frequency electric field strength is to be lowered, and wherein the plurality of members are configured to reduce a degree of variation in high frequency electric field strength distribution on the face of the electrode by converting, at each of the positions of the plurality of members, a current from the high frequency power to heat in order to lower the high frequency electric field strength at those positions.

21. The electrode of claim 20, wherein the at least one electrode including the resistor is an upper electrode, and the resistor is in contact with a surface of the base facing toward said face of the electrode such that said resistor is in contact with a surface of said base facing toward the processing space.

22. The electrode of claim 20, wherein the electrically conductive cover is grounded.

* * * * *